US012561553B2

(12) United States Patent
Karunaratne et al.

(10) Patent No.: US 12,561,553 B2
(45) Date of Patent: Feb. 24, 2026

(54) IN-MEMORY RESONATOR NETWORK FOR FACTORIZING HYPER VECTORS

(71) Applicant: INTERNATIONAL BUSINESS MACHINES CORPORATION, Armonk, NY (US)

(72) Inventors: Kumudu Geethan Karunaratne, Gattikon (CH); Michael Andreas Hersche, Zurich (CH); Giovanni Cherubini, Rueschlikon (CH); Abu Sebastian, Adliswil (CH); Abbas Rahimi, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 1016 days.

(21) Appl. No.: 17/655,026

(22) Filed: Mar. 16, 2022

(65) Prior Publication Data

US 2023/0297816 A1     Sep. 21, 2023

(51) Int. Cl.
*G06N 3/063*      (2023.01)
*G11C 13/00*      (2006.01)

(52) U.S. Cl.
CPC ......... *G06N 3/063* (2013.01); *G11C 13/0002* (2013.01)

(58) Field of Classification Search
CPC .............................. G06N 3/063; G06F 17/16
See application file for complete search history.

(56) References Cited

U.S. PATENT DOCUMENTS

| | | | |
|---|---|---|---|
| 10,522,223 B1* | 12/2019 | Le Gallo-Bourdeau | ..................... G11C 13/0026 |
| 2020/0380384 A1 | 12/2020 | Karunaratne | |
| 2021/0125045 A1* | 4/2021 | Jang | ........................ G06N 3/049 |
| 2023/0048278 A1* | 2/2023 | Noh | ........................ G06N 3/065 |

OTHER PUBLICATIONS

Frady, et al., "Resonator networks for factoring distributed representations of data structures." Published Jul. 7, 2020 by ARXIV. 20 pages. https://arxiv.org/abs/2007.03748.
Karunaratne, et al., "In-memory hyperdimensional computing." Published Apr. 9, 2020 by ARXIV. 16 pages. https://arxiv.org/abs/1906.01548.

(Continued)

*Primary Examiner* — Michael D. Yaary
(74) *Attorney, Agent, or Firm* — Jeffrey M. Ingalls

(57)     ABSTRACT

Predefined concepts are represented by codebooks. Each codebook includes candidate code hypervectors that represent items of a respective concept of the predefined concepts. A neuromorphic memory device with a crossbar array structure includes row lines and column lines stores a value of respective code hypervectors of an codebook. An input hypervector is stored in an input buffer. A plurality of estimate buffers are each associated with a different subset of row lines and a different codebook and initially store estimated hypervectors. An unbound hypervector is computed using the input hypervector and all the estimated hypervectors. An attention vector is computed that indicates a similarity of the unbound hypervector with one estimated hypervector. A linear combination of the one estimated hypervector, weighted by the attention vector, is computed and is stored in the estimate buffer that is associated with the one estimated hypervector.

14 Claims, 20 Drawing Sheets

(56)         References Cited

OTHER PUBLICATIONS

Kent, et al., "Resonator Networks outperform optimization methods at solving high-dimensional vector factorization." Published Jul. 14, 2020 by ARXIV. 61 pages. https:/arxiv.org/pdf/1906.11684.pdf.
Ohno, et al., "Si microring resonator crossbar arrays for deep learning accelerator." Published Apr. 2020 by The Japan Society of Applied Physics. 25 pages. In Japanese Journal of Applied Physics, vol. 59, Issue SG, id.SGGE04. DOI: 10.35848/1347-4065/ab6d82.

* cited by examiner

IN-MEMORY RESONATOR NETWORK FOR FACTORIZING HYPER VECTORS

BACKGROUND

The present invention relates to the field of digital computer systems, and more specifically, to a resonator network system.

SUMMARY

Various embodiments provide a method and resonator network system and computer program product as described by the subject matter of the independent claims. Advantageous embodiments are described in the dependent claims. Embodiments of the present invention can be freely combined with each other if they are not mutually exclusive.

In accordance with an embodiment, a system is presented. The system includes a neuromorphic memory device with a crossbar array structure that includes row lines and column lines. The neuromorphic memory device further includes resistive memory elements coupled between the row lines and the column lines at junctions formed by the row and column lines. The resistive memory elements of each set of row lines store a value of respective code hypervectors of a codebook. Each codebook includes candidate code hypervectors. The system further includes an input buffer that stores an input hypervector. The system further includes a plurality of estimate buffers each associated with a different subset of row lines and a different codebook and initially store estimated hypervectors that are derived from respective code hypervectors that are stored in the associated subset of row lines. The system further includes a control circuit connected to the neuromorphic memory device. The control circuit computes an unbound hypervector using the input hypervector and all the estimated hypervectors, computes an attention vector that indicates a similarity of the unbound hypervector with one estimated hypervector, computes a linear combination of the one estimated hypervector, weighted by the attention vector, and stores the computed linear combination in the estimate buffer that is associated with the one estimated hypervector.

In accordance with another embodiment, a method for factorizing an input hypervector is presented. The method includes storing respective code hypervectors of an associated codebook within row lines of a neuromorphic memory device with a crossbar array structure that includes the row lines and column lines and resistive memory elements coupled between the row lines and the column lines at junctions formed by the row and column lines. Each associated codebook includes candidate code hypervectors. The method further includes storing an input hypervector in an input buffer. The method further includes storing estimated hypervectors within a plurality of estimate buffers each associated with a different subset of row lines and a different codebook. The estimated hypervectors are derived from respective code hypervectors that are stored in the associated subset of row lines. The method further includes computing an unbound hypervector using the input hypervector and all the estimated hypervectors. The method further includes computing an attention vector that indicates a similarity of the unbound hypervector with one estimated hypervector. The method further includes computing a linear combination of the one estimated hypervector, weighted by the attention vector. The method further includes storing the computed linear combination in the estimate buffer that is associated with the one estimated hypervector.

In accordance with yet another embodiment, a computer program product is presented. The computer program product includes a computer-readable storage medium having computer-readable program code embodied therewith. The computer-readable program code, when evoked by a processor, causes the processor to store respective code hypervectors of an associated codebook within row lines of a neuromorphic memory device with a crossbar array structure that includes the row lines and column lines and resistive memory elements coupled between the row lines and the column lines at junctions formed by the row and column lines. Each associated codebook includes candidate code hypervectors. The computer-readable program code, when evoked by a processor, further causes the processor to store an input hypervector in an input buffer and store estimated hypervectors within a plurality of estimate buffers each associated with a different subset of row lines and a different codebook. The estimated hypervectors are derived from respective code hypervectors that are stored in the associated subset of row lines. The computer-readable program code, when evoked by a processor, further causes the processor to compute an unbound hypervector using the input hypervector and all the estimated hypervectors and further causes the processor to compute an attention vector that indicates a similarity of the unbound hypervector with one estimated hypervector. The computer-readable program code, when evoked by a processor, further causes the processor to compute a linear combination of the one estimated hypervector, weighted by the attention vector and further causes the processor to store the computed linear combination in the estimate buffer that is associated with the one estimated hypervector.

BRIEF DESCRIPTION OF THE DRAWINGS

In the following embodiments of the invention are explained in greater detail, by way of example only, making reference to the drawings in which.

DETAILED DESCRIPTION

Figure 1:
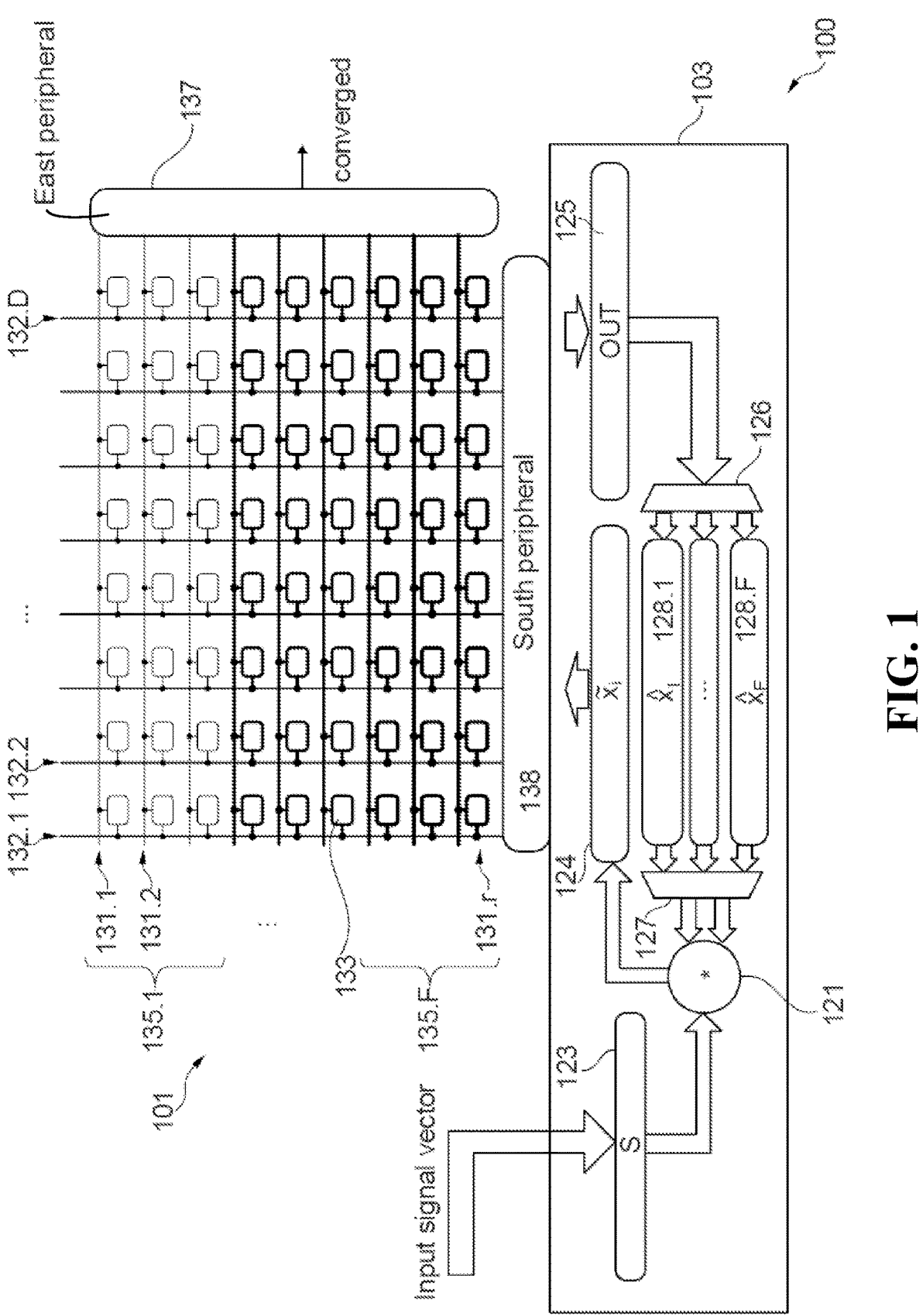
FIG. 1 is a diagram illustrating a resonator network system in accordance with an example of the present subject matter.

The descriptions of the various embodiments of the present invention will be presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Resonator networks as known by one of ordinary skill in the art are discussed in the following references: E. Paxon Frady et al. "Resonator networks for factoring distributed representations of data structures", Neural Computation 2020 and Spencer J. Kent et al. "Resonator Networks outperform optimization methods at solving high-dimensional vector factorization," Neural Computation 2020. Given a hypervector formed from an element-wise product of two or more atomic hypervectors (each from a fixed codebook), the resonator network may find its factors. The resonator network may iteratively search over the alternatives for each factor individually rather than all possible combinations until a set of factors is found that agrees with the input hypervector.

Data structures may represent cognitive concepts, such as colors, shapes, positions, etc. Each cognitive concept may comprise items e.g., items of the color concept may comprise red, green, blue etc. The data structure may contain a combination (e.g., product) of multiple components that each represent a cognitive concept. For example, the data structure may be an image of a red disk in the bottom right and a green rectangle in the top left, wherein the cognitive concepts may be the color, shape, size, and position. In another example, a data structure may form a distributed representation of a tree, wherein each leaf in the tree may represent a concept, and each type of traversal operation in the tree may represent concepts.

The data structure may be encoded by an encoder into a hypervector that uniquely represents the data structure. A hypervector may be a vector of bits, integers, real or complex numbers. The hypervector is a vector having a dimension higher than a minimum dimension, e.g., 100. The hypervector may be holographic with independent and identically distributed (i.i.d) components. The hypervector being holographic means that each bit position in the hypervector may have an equal weight, in contrast to a conventional model with most significant bits and least significant bits. The encoder may combine hypervectors that represent individual concepts with operations in order to represent a data structure. For example, the above mentioned image may be described as a combination of multiplication (or binding) and addition (or superposition) operations as follows: (bottom right*red*disk)+(top left*green*rectangle). The encoder may represent the image using hypervectors that represent the individual concepts and associated operations to obtain the representation of the image as a single hypervector that distinctively represents the knowledge that the disk is red and placed at the bottom right and the rectangle is green and placed at the top left. The encoder may be defined by a vector space of a set of hypervectors which encode a set of cognitive concepts and algebraic operations on this set. The algebraic operations may, for example, comprise a superposition operation and a binding operation. In addition, the algebraic operations may comprise a permutation operation. The vector space may, for example, be a D-dimensional space, where D>100. The hypervector may be a D-dimensional vector comprising D numbers that define the coordinates of a point in the vector space. The D-dimensional hypervectors may be in $\{-1, +1\}^D$ and thus may be referred to as "bipolar." For example, a hypervector may be understood as a line drawn from the origin to the coordinates specified by the hypervector. The length of the line may be the hypervector's magnitude. The direction of the hypervector may encode the meaning of the representation. The similarity in meaning may be measured by the size of the angles between hypervectors. This may typically be quantified as a dot product between hypervectors. The encoder may be a decomposable (i.e., factored) model to represent the data structures. This may be advantageous as the access to the hypervectors may be decomposed into the primitive or atomic hypervectors that represent the individual items of the concepts in the data structure. For example, the encoder may use a Vector Symbolic Architecture (VSA) technique in order to represent the data structure by a hypervector. The encoder may enable to perform an elementwise multiply operation. The encoder may, for example, comprise a trained feed-forward neural network.

Hence, the encoding of data structures may be based on a predefined set of F concepts, where F>1 and candidate items that belong to each of the F concepts. Each candidate item may be represented by a respective hypervector. Each concept may be represented by a matrix of the hypervectors representing candidate items of the concept, e.g., each column of the matrix may be a distinct hypervector. The matrix may be referred to as codebook and the hypervector representing one item of the concept may be referred to as code hypervector. The components of the code hypervector may, for example, be randomly chosen. For example, a codebook that represents the concept of colors may include seven possible colors as candidate items, a codebook that represents the concept of shapes may include 26 possible shapes as candidate items, etc. The codebooks that represent the set of concepts may be referred to as $X_1, X_2 \ldots X_F$ respectively. Each codebook $X_i$ may comprise $M_{x_i}$ code hypervectors $$x_1^i \ldots x_{M_{x_i}}^i.$$

Querying such data structures through their hypervector representations may require decoding the hypervectors. Decoding such hypervectors may be performed by testing every combination of code hypervectors. However, this may be resource intensive. The present subject matter may solve this issue by using a resonator network system. The resonator network system may utilize an iterative approach. In particular, the resonator network system can efficiently decode a given hypervector without needing to directly test every combination of factors, making use of the fact that the superposition operation is used for the encoding of multiple concept items in the given hypervector and the fact that randomized code hypervectors may be highly likely to be close to orthogonal in the vector space, meaning that they can be superposed without much interference. For that, the resonator network system may search for possible factorizations of the given hypervector by combining a strategy of superposition and clean-up memory. The clean-up memory may reduce some crosstalk noise between the superposed concept items. The resonator network system combines the strategy of superposition and clean-up memory to efficiently search over the combinatorially large space of possible factorizations.

Assuming for a simplified description of the iterative process of the resonator network system that the set of concepts comprises three concepts i.e., F=3, but it is not limited thereto. The codebooks/matrices representing the set of concepts may be referred to as X, Y and Z respectively (i.e., $X=X_1$, $Y=X_2$ and $Z=X_3$). The codebook X may comprise $M_x$ code hypervectors $x^1 \ldots x^{M_x}$. The codebook Y may comprise $M_y$ code hypervectors $y^1 \ldots y^{M_y}$. The codebook Z may comprise $M_z$ code hypervectors $z^1 \ldots z^{M_z}$. This may define a search space of size $M=M_x \cdot M_y \cdot M_z$. Since the resonator network system is used, a data structure may be represented by a hypervector s which may be factorized into individual hypervectors representing the set of concepts respectively, i.e., that is, the hypervector s may be defined as follows $s=x^{\alpha}\odot y^{\beta}\odot z^{\gamma}$. The iterative process may find $x^{\alpha}$, $y^{\beta}$, $z^{\gamma}$ where $\alpha\in\{1, 2, \ldots, M_x\}$, $\beta\in\{1, 2, \ldots, M_y\}$ and $\gamma-\in\{1, 2, \ldots, M_z\}$.

The iterative process may be implemented according to the present subject matter using the resonator network system. The resonator network system may include a neuromorphic memory device. The neuromorphic memory device is provided with a crossbar array structure comprising row lines and column lines and resistive memory elements coupled between the row lines and the column lines at junctions formed by the row and column lines. The row lines may be split into sets of rows lines associated with the set of F concepts respectively. For example, for three concepts, the first set of $M_x$ consecutive row lines may be assigned to the first concept (X), the subsequent second set of $M_y$ consecutive row lines may be assigned to the second concept (Y) and the subsequent third set of $M_z$ consecutive row lines may be assigned to the third concept (Z). The resistive memory elements that belong to the first set of row lines may represent values of the code hypervectors of the codebook X (that is, the matrix X may be stored in the resistive memory elements of the first set of row lines). The resistive memory elements that belong to the second set of row lines may represent values of the code hypervectors of the codebook Y (that is, the matrix Y may be stored in the resistive memory elements of the second set of row lines). The resistive memory elements that belong to the third set of row lines may represent values of the code hypervectors of the codebook Z (that is, the matrix Z may be stored in the resistive memory elements of the first set of row lines). The neuromorphic memory device may, thus, enable to store the values of the codebooks and to perform in-memory operations on those values. This may provide a clean-up memory that is built from the codebooks X, Y and Z, which contain all the code hypervectors that are possible factors of the inputs.

Given the hypervector s that represents the data structure and given the set of predefined concepts, an initialization step may be performed by initializing an estimate of the hypervector that represents each concept of the set of concepts. The initial estimates $\hat{x}(0)$, $\hat{y}(0)$ and $\hat{z}(0)$ may, for example, be defined as a superposition of all candidate code hypervectors of the respective concept e.g., $\hat{x}(0)=\text{sign}(\Sigma_{i=1, \ldots, M_x}x^i)$, $\hat{y}(0)=\text{sign}(\Sigma_{j=1, \ldots, M_y}y^j)$ and $\hat{z}(0)=\text{sign}(\Sigma_{k=1, \ldots, M_z}z^k)$. The term "estimate of a hypervector u" refers to a hypervector of the same size as hypervector u. The resonator network system may comprise an input buffer for storing the hypervector s and a set or plurality of estimate buffers for (initially) storing the estimates $\hat{x}(0)$, $\hat{y}(0)$ and $\hat{z}(0)$.

And, for each current iteration t of the iterative process, the following may be performed. Unbound hypervectors $\tilde{x}(t)$, $\tilde{y}(t)$ and $\tilde{z}(t)$ may be computed. Each of the unbound hypervectors may be an estimate of the hypervector that represents the respective concept of the set of concepts. Each of the unbound hypervectors may be inferred from the hypervector s based on the estimates of hypervectors for the other remaining F−1 concepts of the set of concepts which are currently stored in the set of estimate buffers. The unbound hypervectors may be computed as follows: $\tilde{x}(t)=s\odot\hat{y}(t)\lfloor\hat{z}(t)\rfloor$, $\tilde{y}(t)=s\odot\hat{x}(t)\odot\hat{z}(t)$ and $\tilde{z}(t)=s\odot\hat{x}(t)\odot\hat{y}(t)$, where $\odot$ refers to elementwise multiplication (i.e., the Hadamard product). This first definition of the unbound hypervectors may particularly be advantageous if the estimate hypervectors $\hat{x}(t)$, $\hat{y}(t)$ and $\hat{z}(t)$ may be computed in parallel and the unbound hypervectors may be computed in parallel.

However, in case the estimate hypervectors $\hat{x}(t)$, $\hat{y}(t)$ and $\hat{z}(t)$ are computed sequentially (referred to as sequential case) e.g., $\hat{x}(t)$ followed by $\hat{y}(t)$ and then $\hat{z}(t)$, the unbound hypervectors may be computed as follows: $\tilde{x}(t)=s\odot\hat{y}(t)\odot\hat{z}(t)$, $\tilde{y}(t)=s\odot\hat{x}(t+1)\odot\hat{z}(t)$ and $\tilde{z}(t)=s\odot\hat{x}(t+1)\odot\hat{y}(t+1)$. This second definition of the unbound hypervectors may simplify the resonator system structure but still provide accurate results. For example, considering large problem sizes where it takes larger number of time steps to converge, there may be little effect whether $\hat{x}(t+1)$ or $\hat{x}(t)$ is used for the computation of $\hat{y}(t)$. For that, the resonator network system may comprise a circuit that is configured to read the input buffer and the set of estimate buffers and to apply the elementwise multiplications. This may be referred to as an inference step. The inference step may, however, be noisy if many estimates (e.g., F−1 is high) are tested simultaneously.

The unbound hypervectors $\tilde{x}(t)$, $\tilde{y}(t)$ and $\tilde{z}(t)$ may be noisy. This noise may result from crosstalk of many quasi-orthogonal code hypervectors and may be reduced through clean-up memory. After providing the unbound version of a hypervector of a given concept, clean-up memory may be used to find the similarity of each code hypervector of said concept to the unbound version of the hypervector. This may be referred to as a similarity step. The similarity may be computed as a dot product of the codebook that represents said concept by the unbound version of the hypervector, resulting in an attention vector $a_x(t)$, $a_y(t)$ and $a_z(t)$ respectively.

The attention vector may be referred to herein as similarity vector. The similarity vectors $a_x(t)$, $a_y(t)$ and $a_z(t)$ have sizes $M_x$, $M_y$ and $M_z$ respectively and may be obtained as follows: $a_x(t)=X^T\tilde{x}(t)\in\mathbb{R}^{M_x}$, $a_y(t)=Y^T\tilde{y}(t)\in\mathbb{R}^{M_y}$ and $a_z(t)$ $Z^T\tilde{z}(t)\in\mathbb{R}^{M_z}$. For example, for computing the similarity vector $a_x(t)$, the unbound hypervector $\tilde{x}(t)$ may be input to the column lines of the neuromorphic memory device for receiving through the first set of row lines of the concept the computed similarity vector $a_x(t)$ indicating a similarity of the unbound hypervector $\tilde{x}(t)$ with each candidate code hypervector of the concept (X) e.g., the largest element of $a_x(t)$ may indicate the code hypervector which matches best the unbound hypervector $\tilde{x}(t)$. For computing the similarity vector $a_y(t)$, the unbound hypervector $\tilde{y}(t)$ may be input to the column lines of the neuromorphic memory device for receiving through the second set of row lines of the concept the computed similarity vector $a_y(t)$ indicating a similarity of the unbound hypervector $\tilde{y}(t)$ with each candidate code hypervector of the concept (Y) e.g., the largest element of $a_y(t)$ may indicate the code hypervector which matches best the unbound hypervector $\tilde{y}(t)$. For computing the similarity vector $a_z(t)$, the unbound hypervector $\tilde{z}(t)$ may be input to the column lines of the neuromorphic memory device for receiving through the third set of row lines of the concept the computed similarity vector $a_z(t)$ indicating a similarity of the unbound hypervector $\tilde{z}(t)$ with each candidate code hypervector of the concept (Z) e.g., the largest element of $a_z(t)$ indicates the code hypervector which matches best the unbound hypervector $\tilde{z}(t)$.

A weighted superposition of the similarity vectors $a_x(t)$, $a_y(t)$ and $a_z(t)$ may be performed. This may be referred to as the superposition step. The superposition step may be performed on the similarity vectors $a_x(t)$, $a_y(t)$ and $a_z(t)$ as follows: $\hat{x}(t+1)=a_x(t)X$, $\hat{y}(t+1)=a_y(t)Y$ and $\hat{z}(t+1)=a_z(t)Z$ respectively, in order to obtain the current estimates $\hat{x}(t+1)$, $\hat{y}(t+1)$ and $\hat{z}(t+1)$ respectively of the hypervectors that represent the set of concepts. In other words, the superposition step generates each of the estimates $\hat{x}(t+1)$, $\hat{y}(t+1)$ and $\hat{z}(t+1)$ representing the respective concept by a linear combination of the candidate code hypervectors (provided in respective matrices X, Y and Z), with weights given by the respective similarity vectors $a_x(t)$, $a_y(t)$ and $a_z(t)$. For example, for computing the estimate hypervector $\hat{x}(t+1)$, the similarity vector $a_x(t)$ may be input (back) to the first set of row lines so that the linear combination may be performed in-memory using the stored values of the codebook X. The elements of the estimate hypervector $\hat{x}(t+1)$ may be obtained from the column lines respectively. For computing the estimate hypervector $\hat{y}(t+1)$, the similarity vector $a_y(t)$ may be input (back) to the second set of row lines so that the linear combination may be performed in-memory using the stored values of the codebook Y. The elements of the estimate hypervector $\hat{y}(t+1)$ may be obtained from the column lines respectively. For computing the estimate hypervector $\hat{z}(t+1)$, the similarity vector $a_z(t)$ may be input (back) to the third set of row lines so that the linear combination may be performed in-memory using the stored values of the codebook Z. The elements of the estimate hypervector $\hat{z}(t+1)$ may be obtained from the column lines respectively.

The iterative process may stop if a convergence criterion is fulfilled. The convergence criterion may, for example, require that the value of at least one element of each similarity vector $a_x(t)$, $a_y(t)$ and $a_z(t)$ exceeds a predefined threshold. In another example, the convergence criterion may require a predefined number of iterations to be reached.

The present subject matter may provide a micro architecture to implement a high dimensional vector factorizing resonator network system using crossbar arrays where dot product operations are in-memory. The present subject matter may efficiently factorize the hypervector representing a data structure into the primitives from which it is composed. For example, given a hypervector formed from an element-wise product of two or more hypervectors, its factors (i.e., the two or more hypervectors) may be efficiently found. This way, a nearest-neighbor lookup may need only search over the alternatives for each factor individually rather than all possible combinations. This may reduce the number of operations involved in every iteration of the resonator network system and hence reduce the complexity of execution. This may also solve larger size problems (at fixed dimensions) and improve the robustness against noisy input hypervectors.

FIG. 1 is a diagram illustrating a resonator network system in accordance with an example of the present subject matter. The resonator network system 100 may support in-memory binary dot product operations. The resonator network system 100 may, for example, be used for factorizing hypervectors according to a predefined set of concepts. The set of concepts comprises F concepts, F being a positive integer number. The codebooks/matrices representing the set of concepts may be referred to as $X_1, X_2 \ldots X_F$ respectively. Each codebook $X_i$ may comprise $M_{x_i}$ code hypervectors $$x_i^1 \ldots x_i^{M_{x_i}}.$$

The resonator network system 100 comprises a neuromorphic memory device 101 with a crossbar array structure of memristors that provide local data storage. The crossbar array structure includes r row lines 131.1-131.$r$ (collectively referred to as 131) and D column lines 132.1-132.D (collectively referred to as 132), where the row lines 131 and column lines 132 are interconnected at junctions via electronic devices 133. The number of columns corresponds to the size of the hypervectors, where the number of row lines r may be equal to the number of all items represented by the codebooks e.g., $r=\Sigma_{i=1}^{F}M_{x_i}$. For ease of illustration, only one electronic device 133 is labeled with a reference number in FIG. 1. The electronic devices 133 may be programmed so as to incrementally change states of the electronic devices 133. Each electronic device 133 of the neuromorphic memory device 101 may possibly include one or more memristive devices. Several types of memristive devices may be contemplated, such as phase change memories (PCM) cells, resistive random-access memory (RRAM), static random-access memory (SRAM) cells, or electro-chemical random-access memory (ECRAM) cells. In other variants, flash memory cells may be used. Programming the electronic devices 133 may result in incrementally changing states of the electronic devices 133 (e.g., change the electrical conductances of the electronic devices 133). The states of the electronic devices 133 may correspond to certain values which determine data as stored on the neuromorphic memory device 101. The neuromorphic memory device 101 may thus provide a memory matrix K of dimension r×D.

The row lines 131 may comprise F sets of consecutive row lines 135.1-135.F which are associated respectively with the F concepts. Each set of row lines 135.1-F may comprise a number of row lines that correspond respectively to the items of the respective concept. The column lines 132 may be associated with the D elements of the hypervector respectively. The electronic devices 133 that are at the junction of each set of row lines and the column lines may represent values of the codebook associated with said set of row lines. For example, electronic devices 133 that are at the junction of the set of row lines 135.$i$ and the column lines 132 may represent values of the codebook $X_i$ so that each column of the codebook $X_i$ may be stored in the electronic devices 133 along a respective row line, where i varies between 1 and F, e.g., $x_i^1$ may be stored on the electronic devices 133 along the first row line of the set of row lines 135.$i$ . . . and $$x_i^{M_{x_i}}$$

may be stored in the $M_{x_i}^{th}$ row line of the set of row lines 135.$i$.

The neuromorphic memory device 101 may comprise peripheral circuits 137 and 138. Each of the peripheral circuits 137 and 138 comprises elements that enable to input data and obtain output results. For example, each of the peripheral circuits 137-138 may comprise transimpedance amplifiers (TIAs) to convert collected currents to voltages and analog-to-digital converters (ADCs) to transform the voltages to the binary numbers. Each of the peripheral circuits 137-138 may, for example, comprise sense amplifiers and digital-to-analog converters (DACs) to convert binary numbers to input voltages.

The resonator network system 100 further comprises a control circuit 103. The control circuit 103 may comprise buffers and a computation logic 121. The buffers comprise an input buffer 123 for storing an input hypervector s which may represent a data structure such as an image. The buffers further comprise a set of F estimate buffers 128.1-128.F for storing the estimates of hypervectors (e.g., $\hat{x}_1 \ldots \hat{x}_F$) of the set of F concepts respectively. The computation logic 121 is configured to compute an unbound vector using the input hypervector s and the corresponding estimate hypervectors e.g., the computation logic 121 may compute an unbound hypervector $\tilde{x}_i$ as follows: $\tilde{x}_i=s\odot\hat{x}_1 \ldots \odot\hat{x}_{i-1}\odot\hat{x}_{i+1} \ldots \odot\hat{x}_F$ using the input hypervector s and the estimates of hypervectors (having index different from i, where i varies between 1 and F, the number of concepts). The F−1 estimates $\hat{x}_1 \ldots \hat{x}_{i-1}, \hat{x}_{i+1} \ldots \hat{x}_F$, may be obtained from the corresponding estimate buffers 128.1-F using a selector 127. The computed unbound hypervector $\tilde{x}_i$ may be stored in temporal input buffer 124. The estimate hypervectors (e.g., $\hat{x}_1 \ldots \hat{x}_F$) may, for example, be received as outputs of the neuromorphic memory device 101. The output of the neuromorphic memory device 101 may, for example, be stored in temporal output buffer 125 and may be stored on the corresponding estimate buffer 128.1-F using a selector 126.

Reading from the neuromorphic memory device 101 may be achieved via a vector-matrix multiplication which can be performed in constant time, meaning that data may possibly be retrieved during any operation cycle. In practice, however, read operations may only be performed at specific times (e.g., according to the general algorithm run at the control circuit 103) and not necessarily at each operation cycle. Generally, data can be retrieved via a multiply-accumulate operation which may be parameterized by values corresponding to the states of the electronic devices 133.

The resonator network system 100 may be configured to perform the iterative process of the resonator network in order to factorize the input hypervector s stored in the input buffer 123 into individual hypervectors representing the set of F concepts respectively. FIG. 1 may represent the sequential case e.g., in order to compute the unbound hypervectors using the second definition. FIG. 1 may be adapted to perform the computation of the unbound hypervectors using the first definition e.g., the set of estimate buffers may comprise two consecutive subsets of F buffers to store the estimate hypervectors of two consecutive iterations (e.g., one first subset of estimate buffers for storing $\hat{x}_1(t) \ldots \hat{x}_F(t)$ and the second subset of estimate buffers for storing $\hat{x}_1(t+1) \ldots \hat{x}_F(t+1)$ being computed, wherein after $\tilde{x}_i(t)$ are computed, $\hat{x}_1(t) \ldots \hat{x}_F(t)$ may be replaced by $\hat{x}_1(t+1) \ldots \hat{x}_F(t+1)$ and new computed $\hat{x}_1(t+2) \ldots \hat{x}_F(t+2)$ may be stored in the second subset of estimate buffers etc.).

Figure 2:
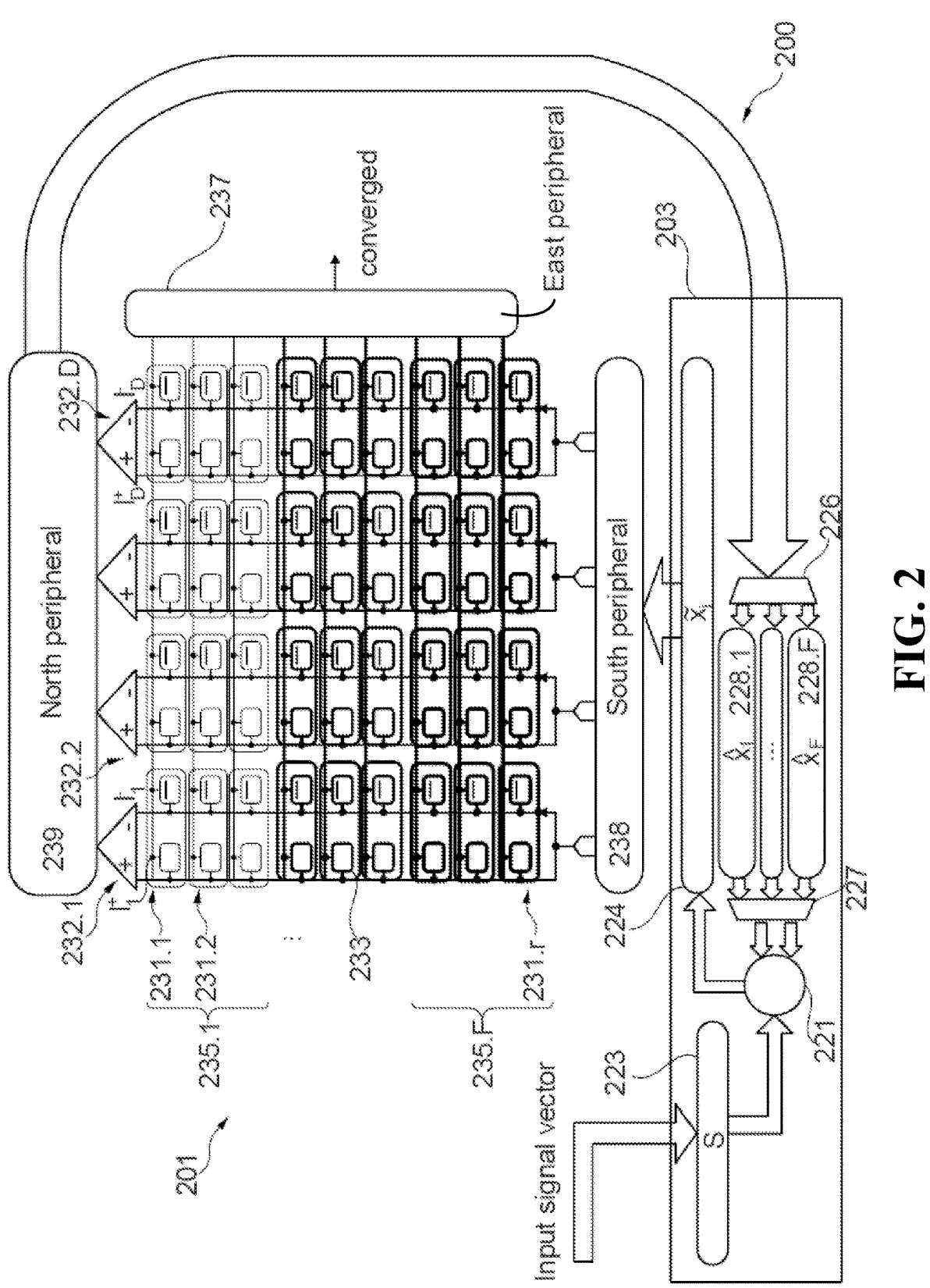
FIG. 2 is a diagram illustrating a resonator network system in accordance with an example of the present subject matter.

FIG. 2 is a diagram illustrating a resonator network system 200 in accordance with an example of the present subject matter. The resonator network system 200 may support in-memory bipolar dot product operations.

The resonator network system 200 comprises a neuromorphic memory device 201 with a crossbar array structure of memristors that provide local data storage. The resonator network system 200 may support bipolar vectors and bipolar dot product as opposed to binary operations in resonator network system 100. The crossbar array structure includes row lines 231.1-231.r (collectively referred to as 231) and column lines 232.1-232.D (collectively referred to as 232). The row lines 231 may comprise F sets of consecutive row lines 235.1-235.F which are associated respectively with the F concepts. The row lines 231 and column lines 232 are interconnected at junctions via electronic devices 233 (e.g., memristive devices). For ease of illustration, only one electronic device 233 is labeled with a reference number in FIG. 2. By contrast to the neuromorphic memory device 101 of FIG. 1, dual column lines are provided, one to store positive values, and another to store negative values. Thus, the neuromorphic memory device 201 may provide a memory matrix $K^+$ of dimension r×D for positive values and a memory matrix $K^-$ of dimension r×D for negative values. For example, each column line 232.1-D consists of two vertical lines together representing signed values in the array and their currents are subtracted to get the net current of that column as given by the following equation $I_j=I_j^+-I_j^-$, where $I_j^+=\Sigma_{i=1:F}K_j^+(i)\times v_i$ and $I_j^-=\Sigma_{i=1:F}K_j^-(i)\times v_i$, where $v_i$ may represent an element of an attention vector. $K^+$ may encode a positive part of a weight, and $K^-$ may encode a negative part of a weight. For example, $K^+=K$ and $K^-=0$ if the matrix K is positive, and $K^+=0$ and $K^-=|K|$ if K is negative. The output attention vector $a_x$ from the crossbar may, for example, be obtained as follows: $a_x=\Sigma_{i=1}^D\hat{x}_l \& X_l+\overline{\hat{x}_l} \& \overline{X}_l$, where l refers to $l^{th}$ column, and $l^{th}$ column elements e.g., in $\hat{x}$ and codebook X.

The neuromorphic memory device 201 may, for example, form a crossbar of PCM devices. Current through a single memristor device is a product of the voltage applied across it and its conductance value. Matrix-vector multiplication may be computed by applying voltages along the row lines/column lines of the neuromorphic memory device 201 and summing up currents (using Kirchhoff's current law) along the column lines/row lines. Net output current is usually measured using analog to digital converter (ADC) for further computations.

The neuromorphic memory device 201 may comprise peripheral circuits 237, 238 and 239. Each of the peripheral circuits 237, 238 and 239 comprises elements that enable to input data and/or obtain output results. For example, the peripheral circuit 239 may comprise transimpedance amplifiers (TIAs) to convert collected currents to voltages and ADCs to transform the voltages to the binary numbers. The peripheral circuit 237 or 238 may, for example, comprise DACs to convert binary numbers to input voltages.

The resonator network system 200 further comprises a control circuit 203. The control circuit 203 may comprise buffers and a computation logic 221. The buffers comprise an input buffer 223 for storing an input hypervector s which may represent a data structure such as an image. The buffers further comprise a set of F estimate buffers 228.1-228.F for storing the estimate hypervectors (e.g., $\hat{x}_1 \ldots \hat{x}_F$) of the set of F concepts respectively. The computation logic 221 is configured to compute an unbound vector using the input hypervector s and the corresponding estimate hypervectors e.g., the computation logic 221 may compute an unbound hypervector $\tilde{x}_i$ as follows $\tilde{x}_i=s\odot\hat{x}_1 \ldots \odot\hat{x}_{i-1} \odot\hat{x}_{i+1} \ldots \odot\hat{x}_F$ using the input hypervector s and the estimate hypervectors (having index different from i, where i varies between 1 and F the number of concepts). The F−1 estimate hypervectors $\hat{x}_1 \ldots \hat{x}_{i-1}, \hat{x}_{i+1} \ldots \hat{x}_F$ may be obtained from the corresponding estimate buffers 228.1-F using a selector 227. The computed unbound hypervector $\tilde{x}_i$ may be stored in temporal buffer 224. The estimate hypervectors (e.g., $\hat{x}_1 \ldots \hat{x}_F$) may, for example, be received as outputs of the neuromorphic memory device 101. The output of the neuromorphic memory device 101 may, for example, be received from the peripheral circuit 239 and may be stored on the corresponding estimate buffer 228.1-F using a selector 226.

The resonator network system 200 may be configured to perform the iterative process of the resonator network in order to factorize the input hypervector s stored in the input buffer 223 into individual hypervectors representing the set of F concepts respectively.

Figure 3A:
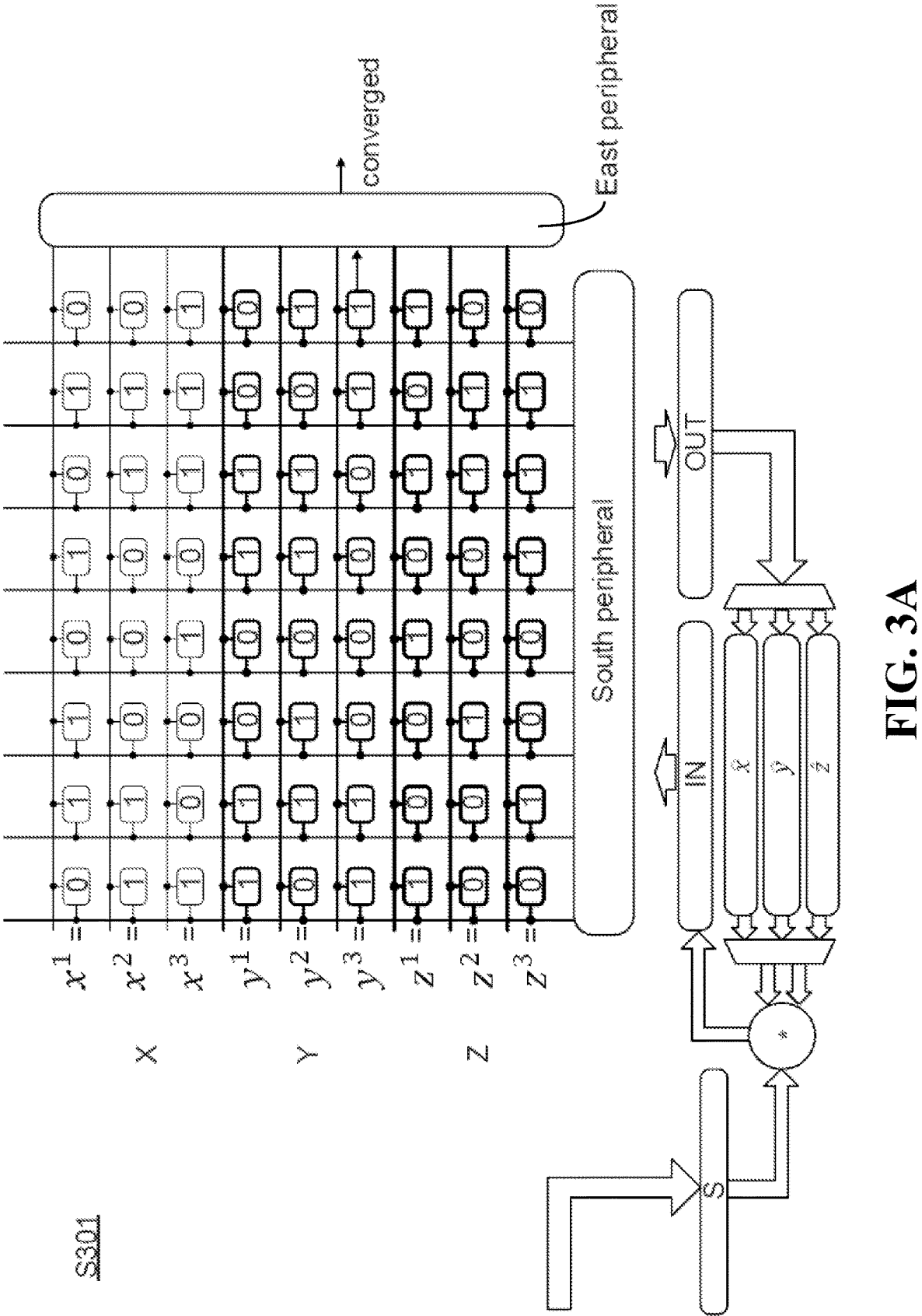
FIGS. 3A-Q illustrate states of the resonator network system during execution of a method in accordance with an example of the present subject matter.
Figure 3B:
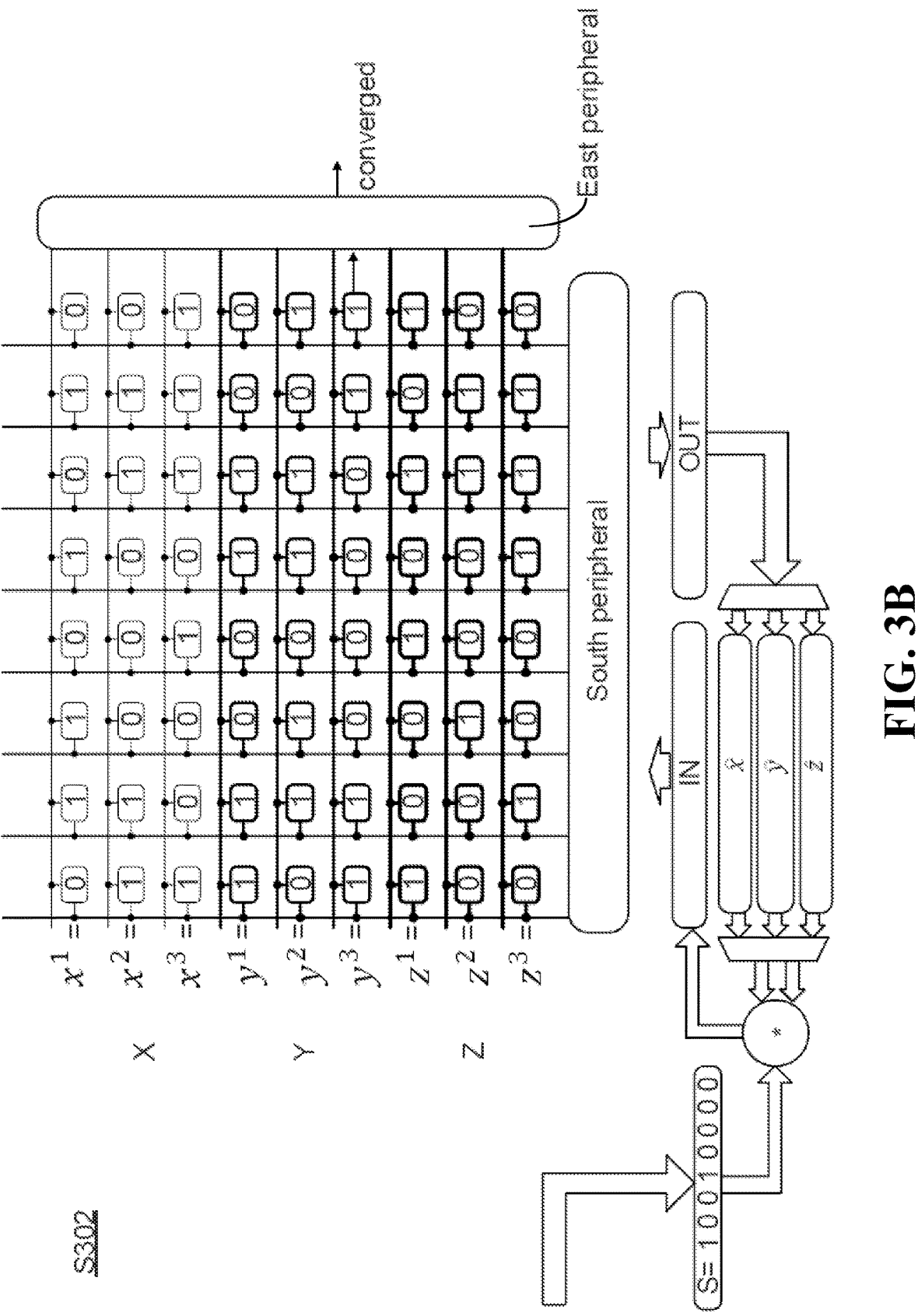
Figure 3C:
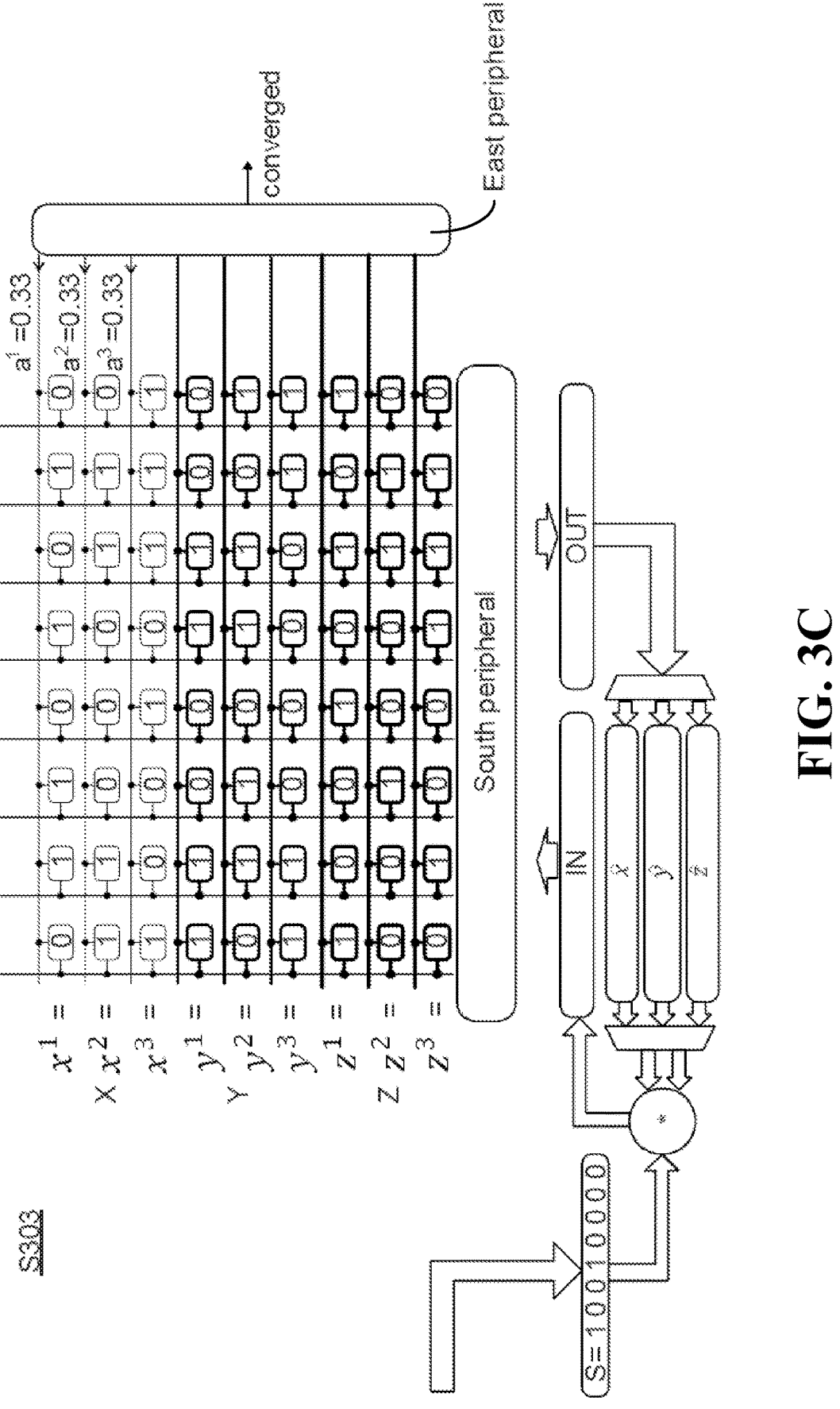
Figure 3D:
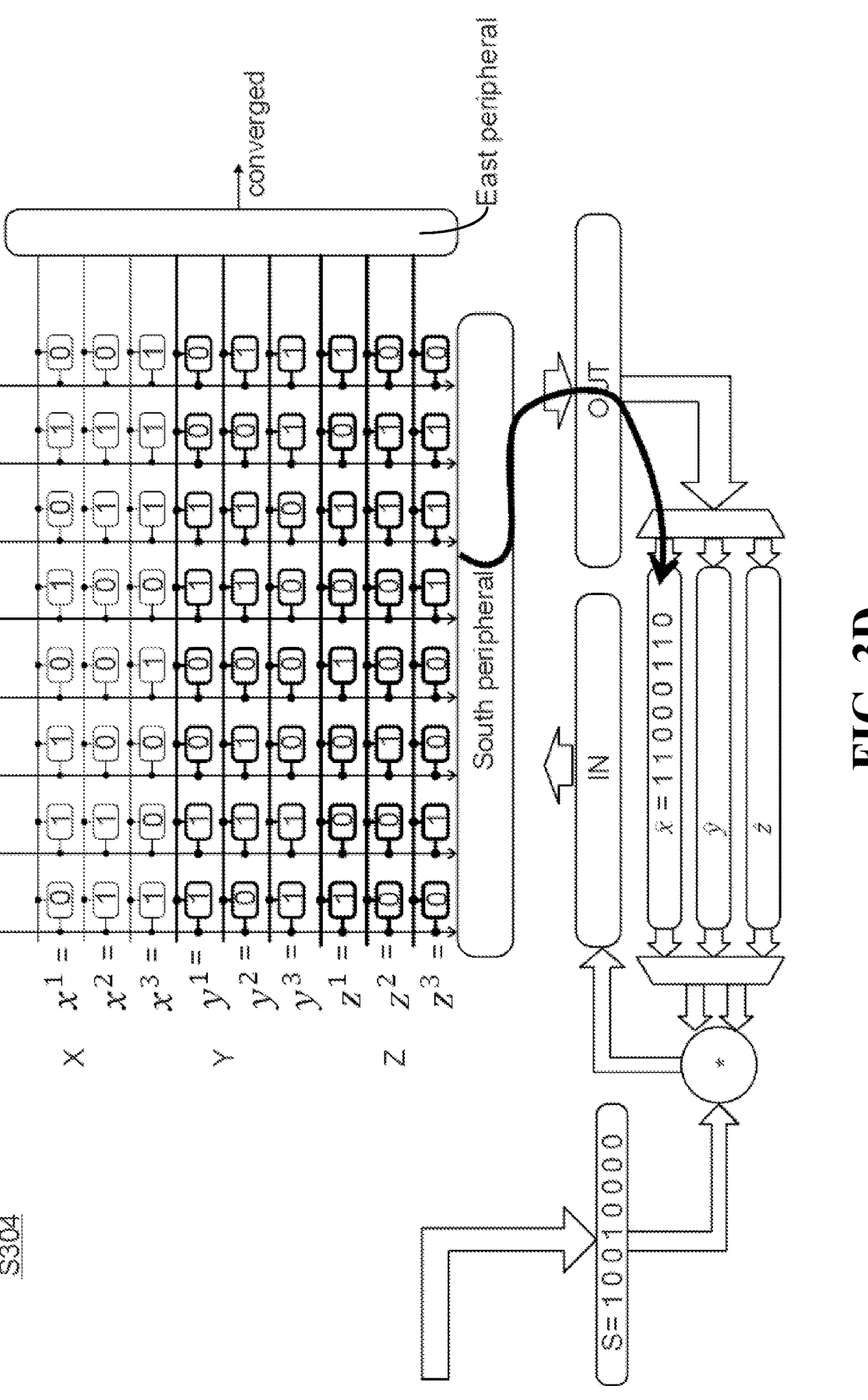
Figure 3E:
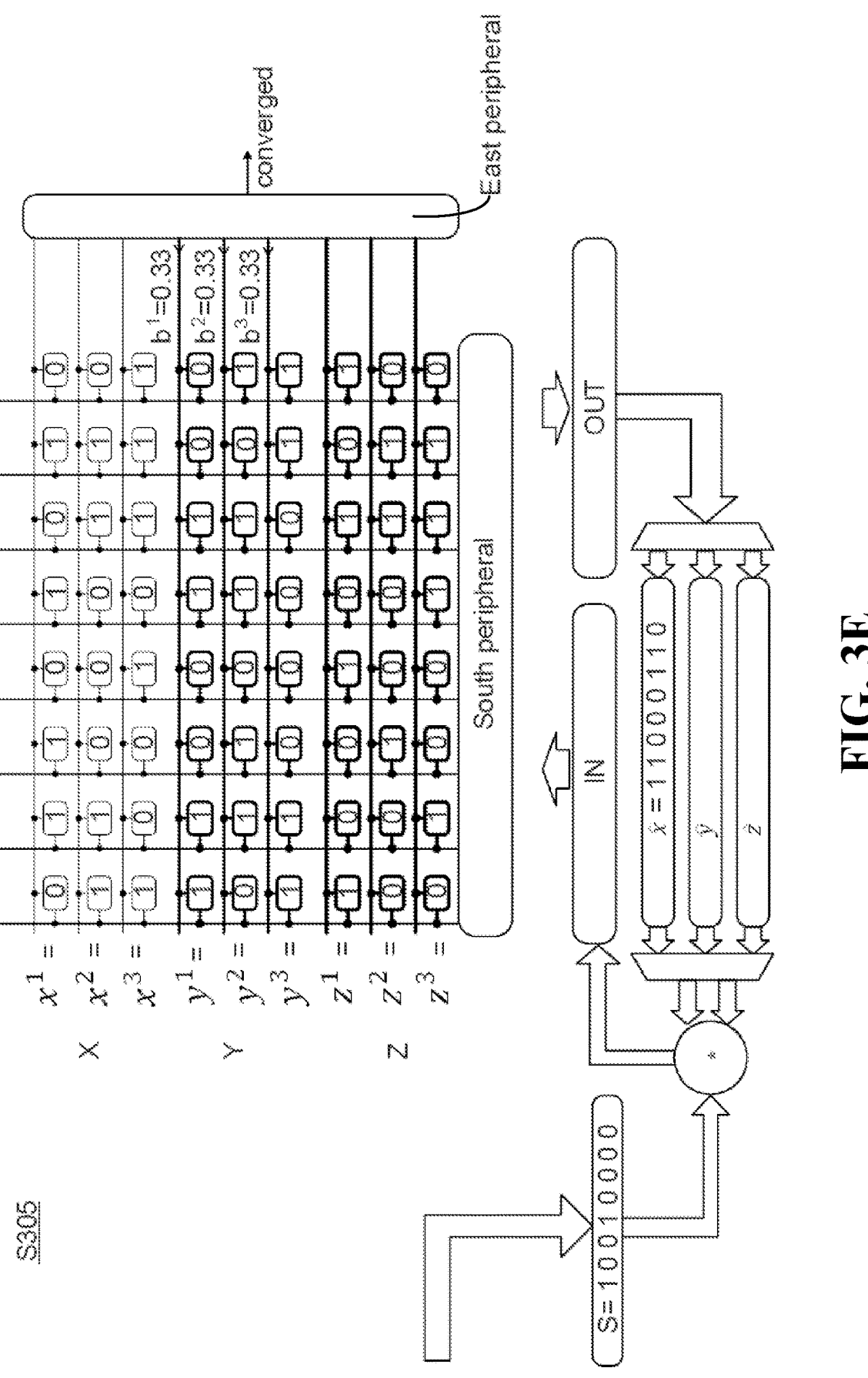
Figure 3F:
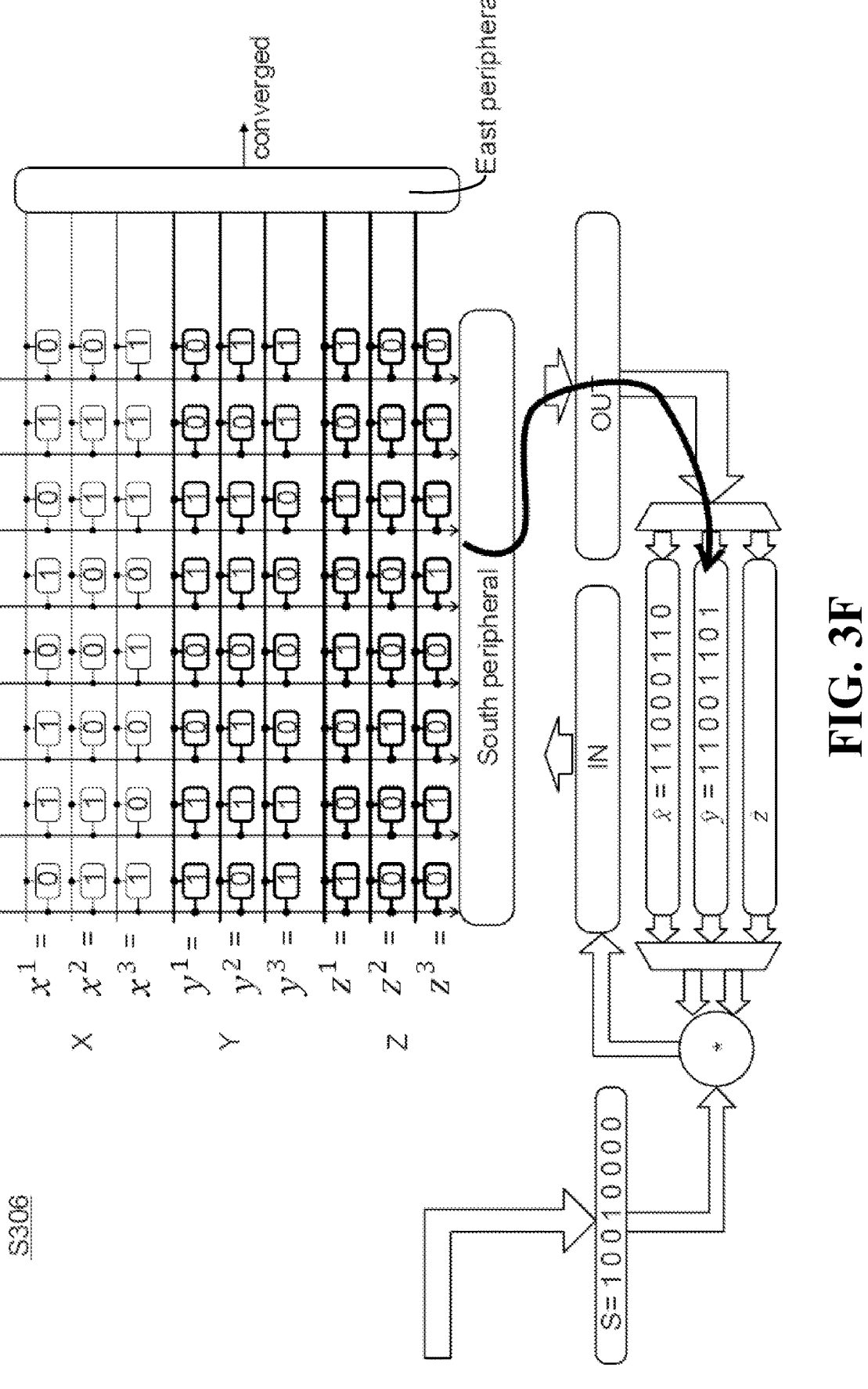
Figure 3G:
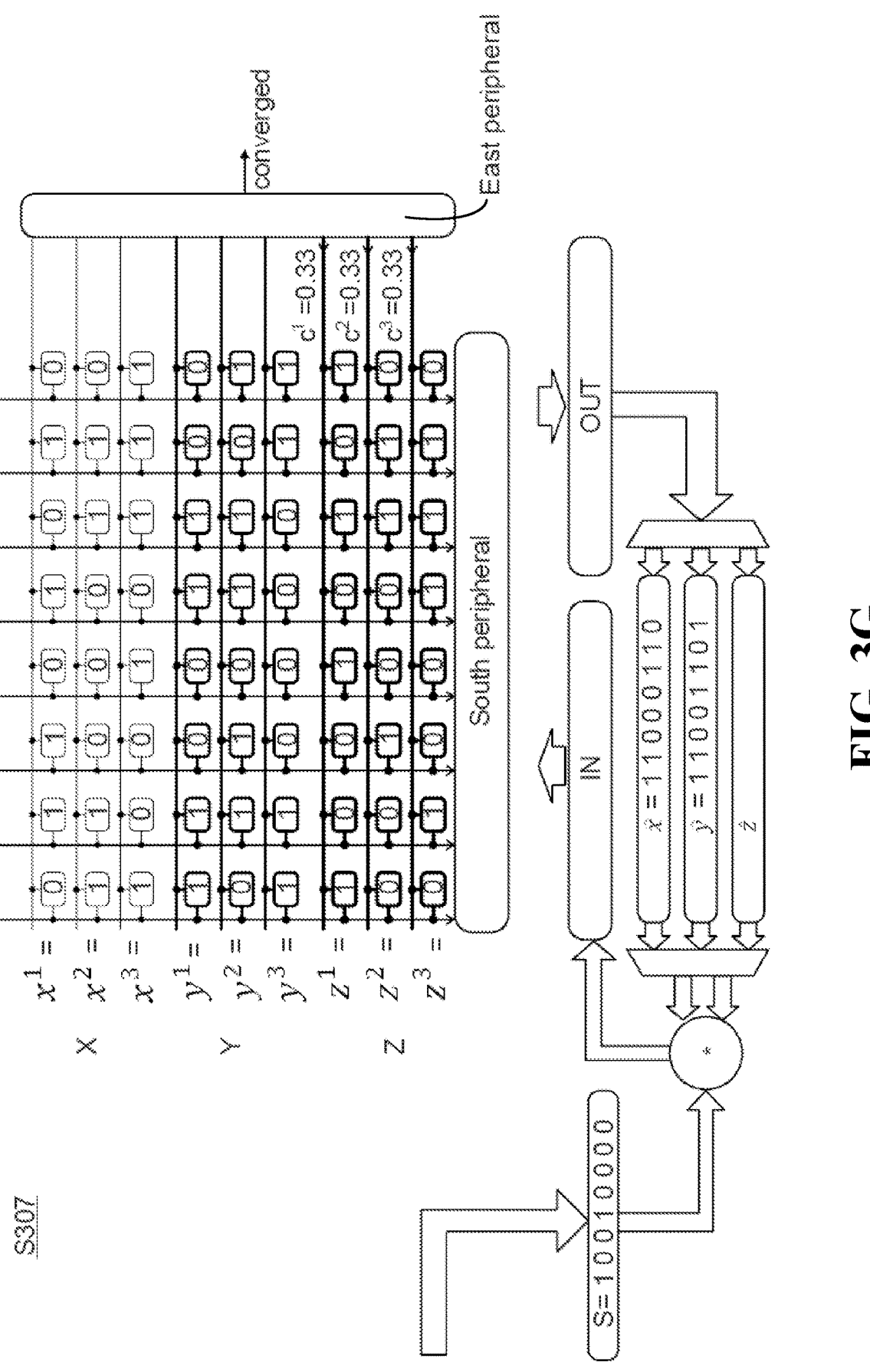
Figure 3H:
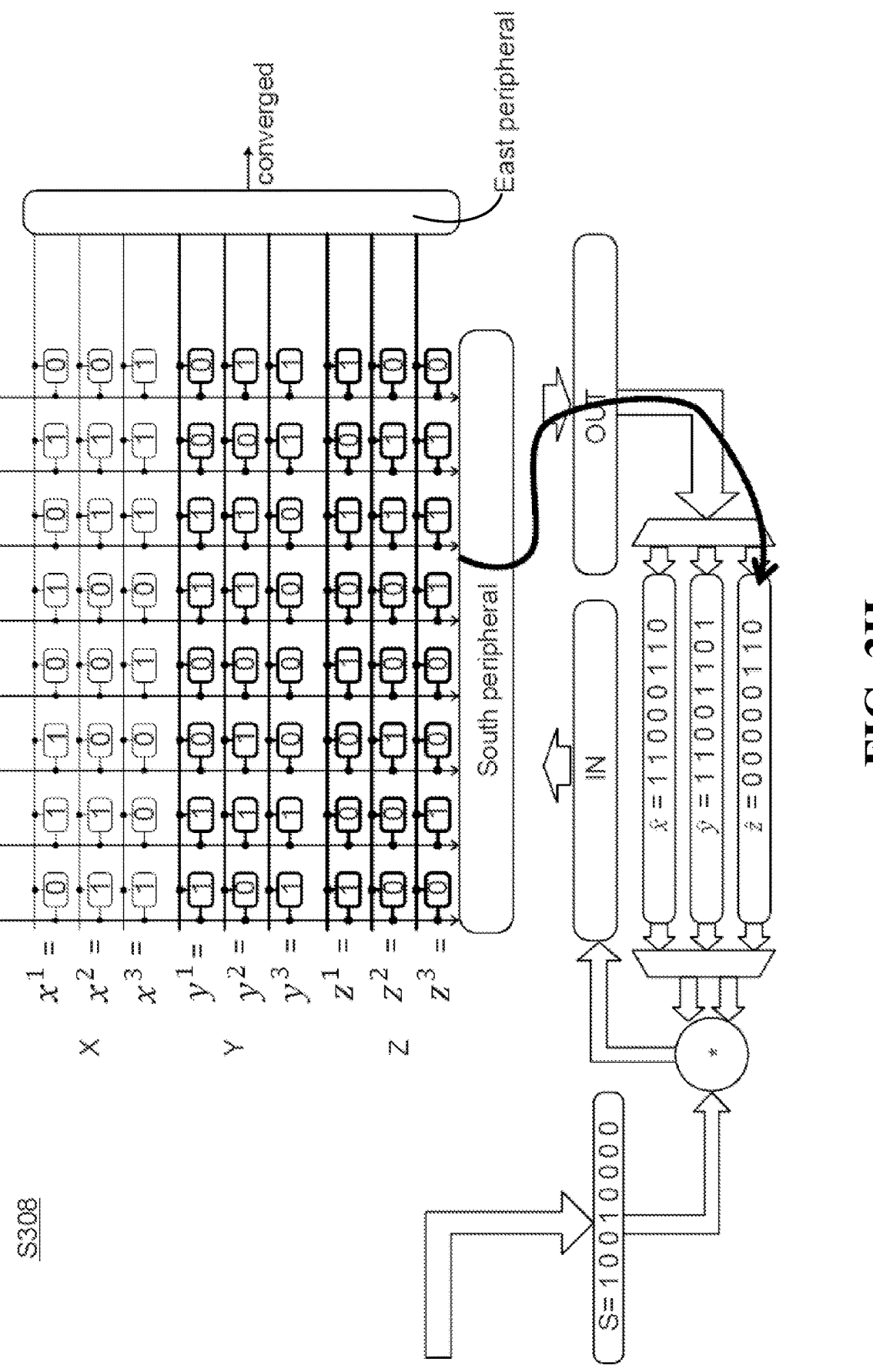
Figure 3I:
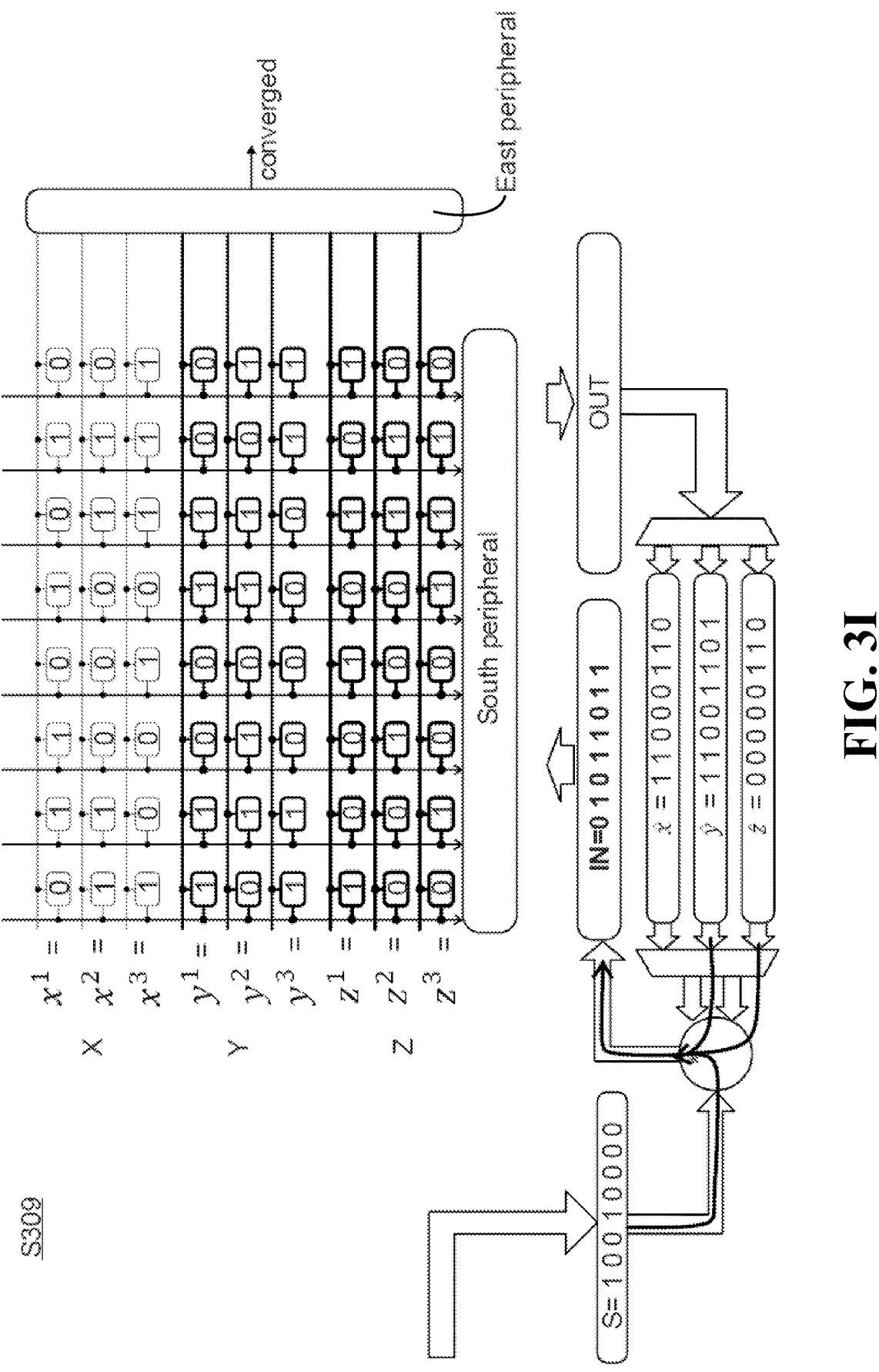
Figure 3J:
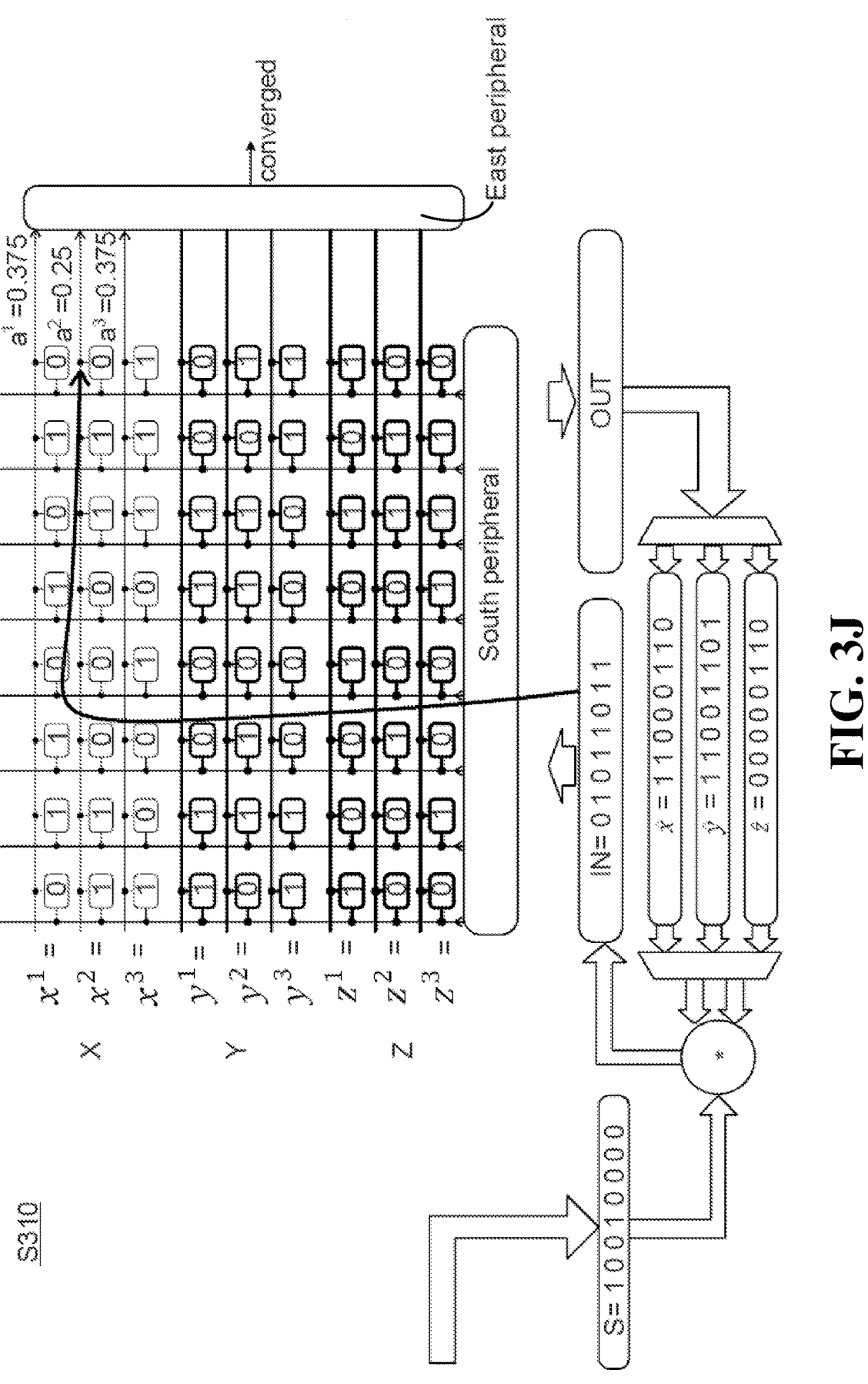
Figure 3K:
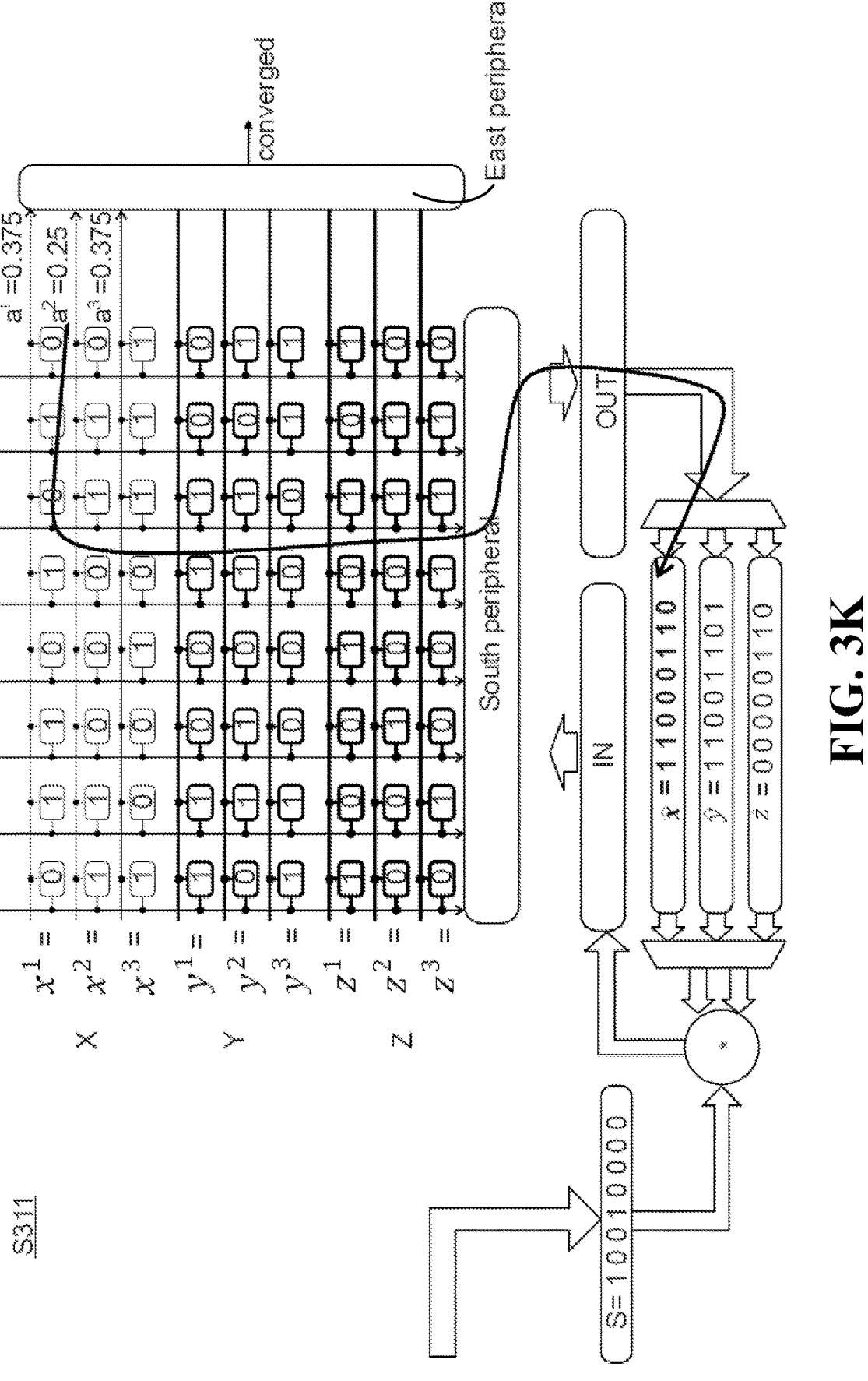
Figure 3L:
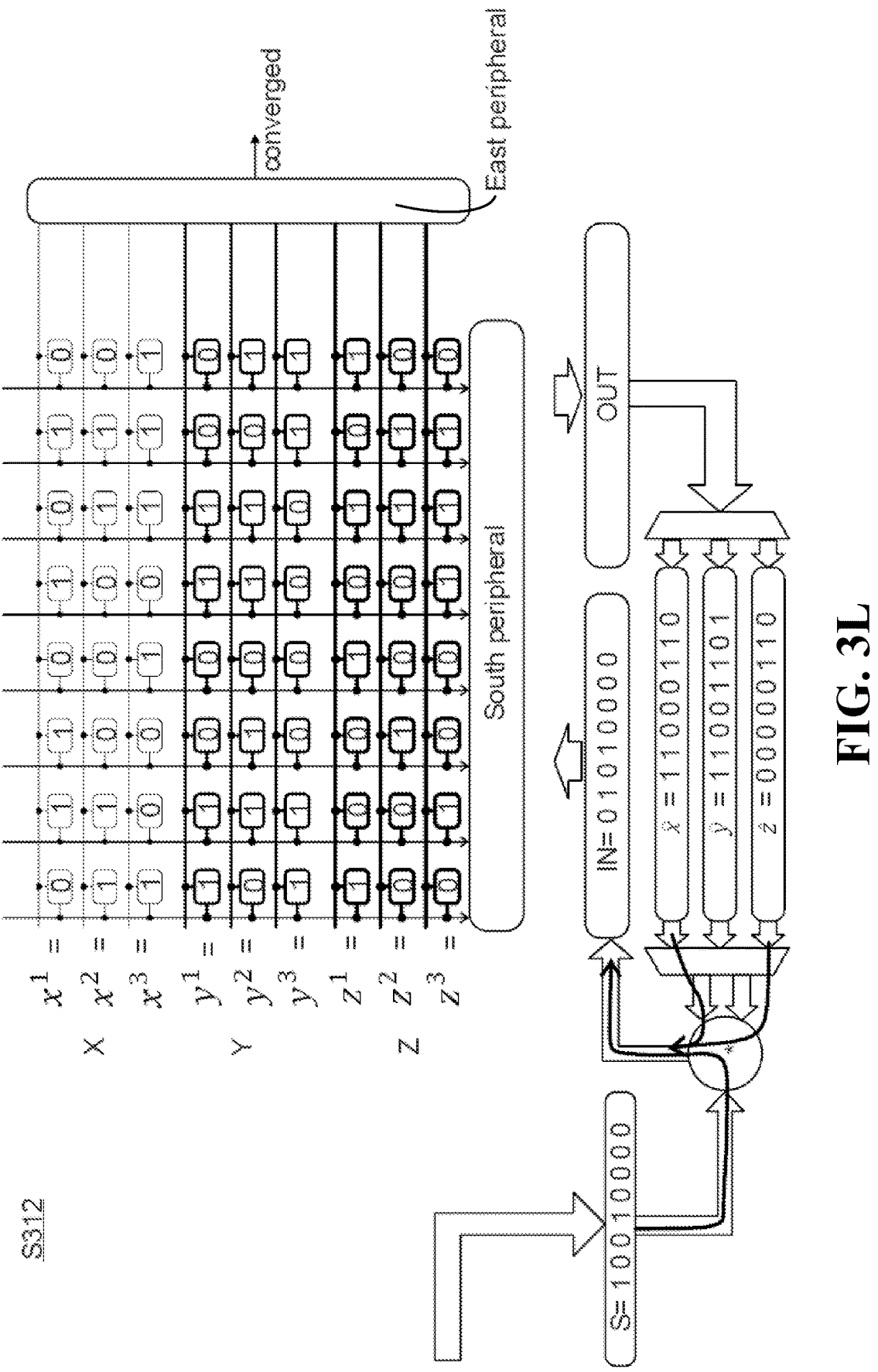
Figure 3M:
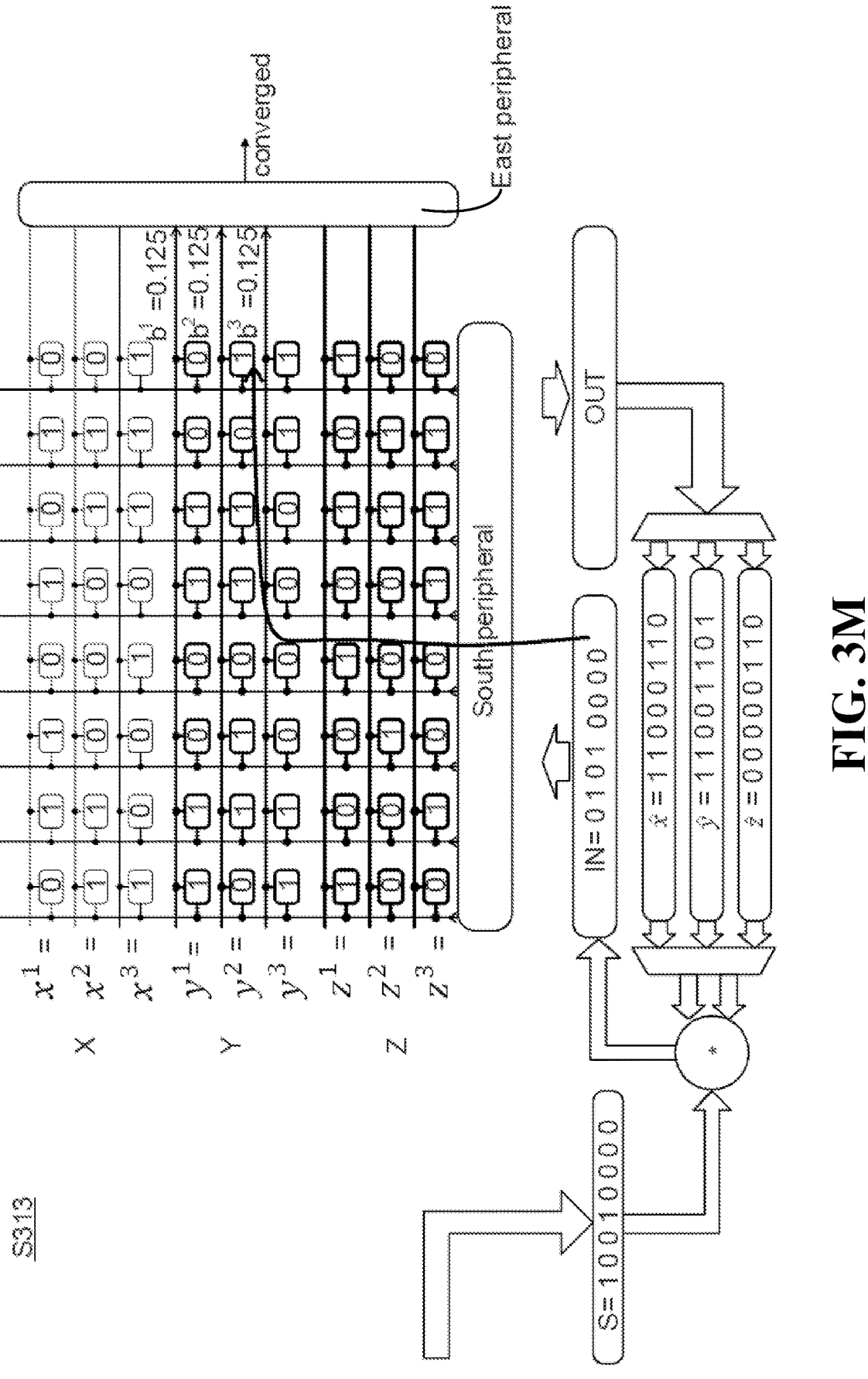
Figure 3N:
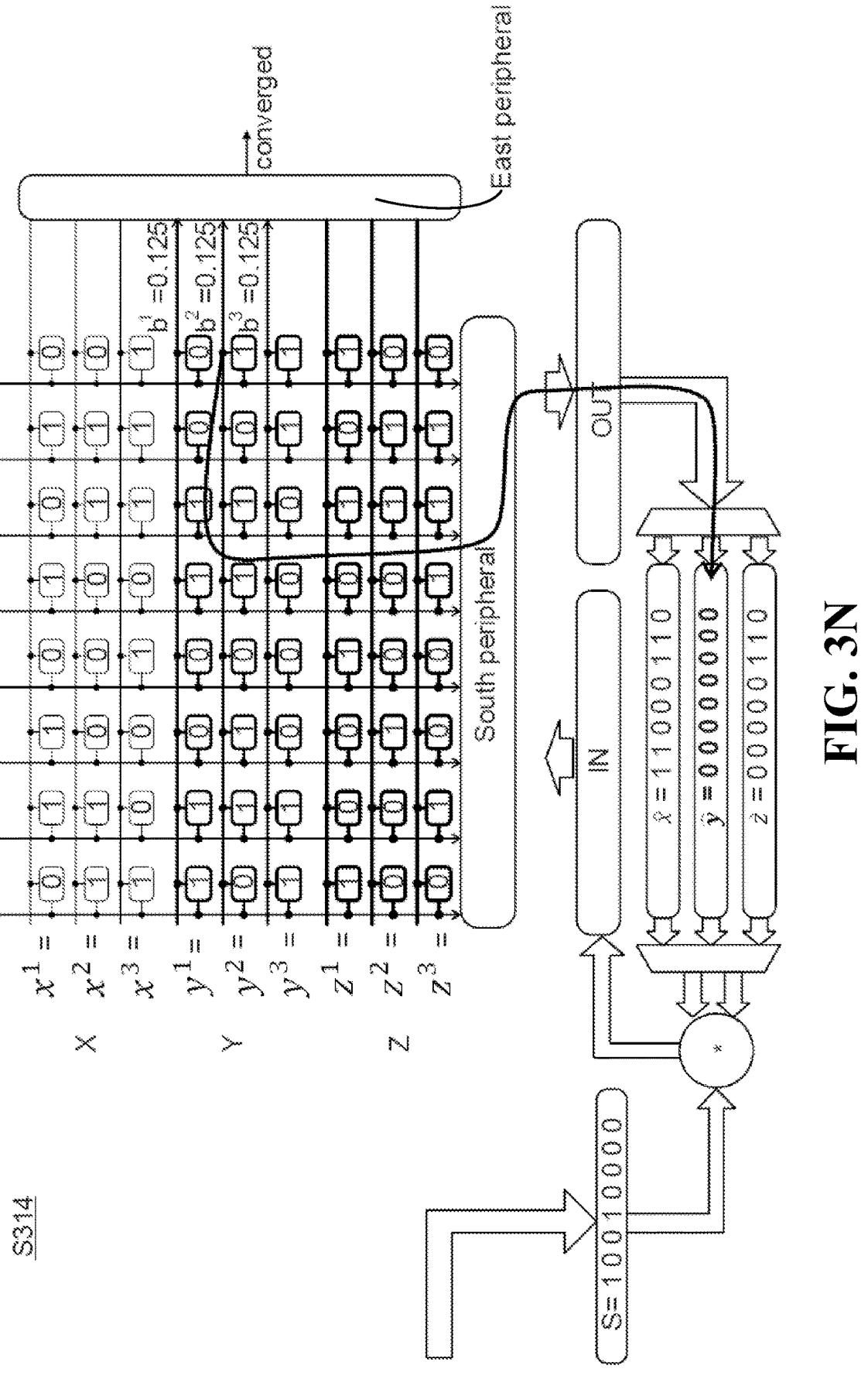
Figure 30:
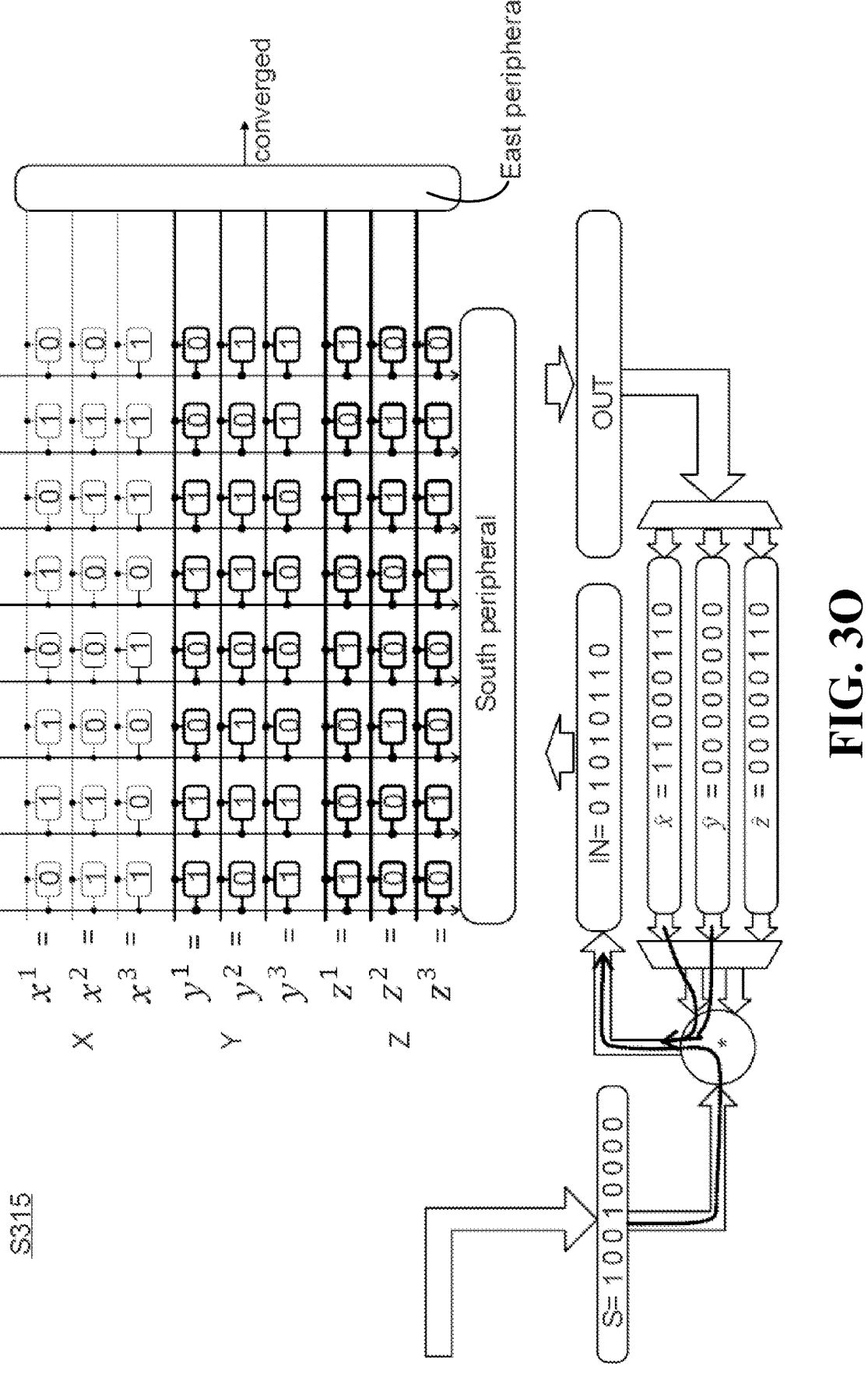
Figure 3P:
Figure 3Q:
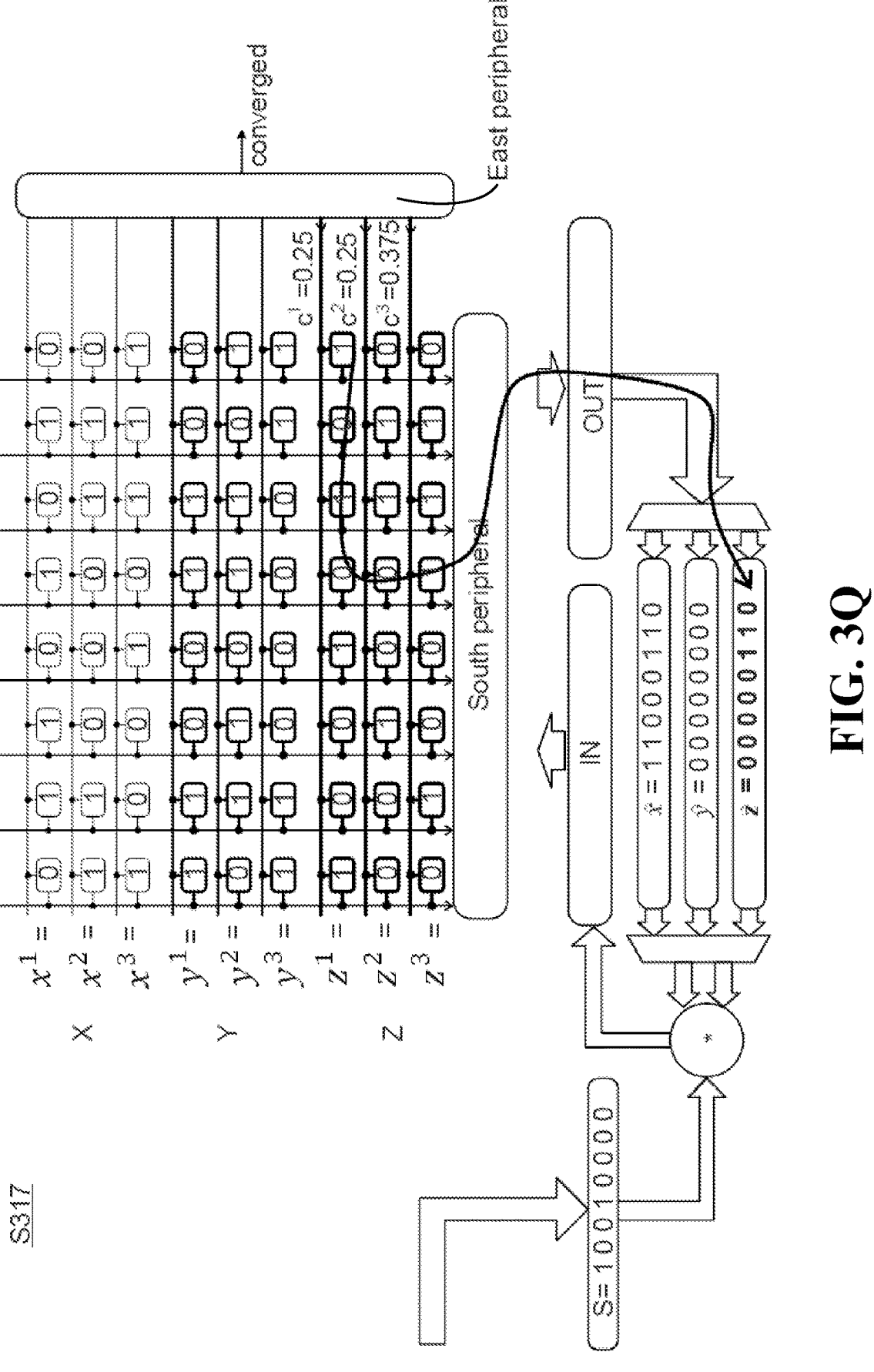

FIGS. 3A-Q illustrate the states of a resonator network system for performing the iterative process of a resonator network in accordance with an example of the present subject matter. The resonator network system of FIGS. 3A-Q may be the resonator network system 100 of FIG. 1, wherein the number of concepts F is set to three (F=3) for simplification of the description. The set of concepts may, for example, be represented by the codebooks X, Y and Z respectively. The codebook X may comprise $M_x=3$ code hypervectors $x^1$, $x^2$ and $x^3$. The codebook Y may comprise $M_y=3$ code hypervectors $y^1$, $y^2$ and $y^3$. The codebook Z may comprise $M_z=3$ code hypervectors $z^1$, $z^2$ and $z^3$. Following the above notations, the codebooks are defined as $X_1=X$, $X_2=Y$ and $X_3=Z$.

In the initial state S301 of the resonator network system 100 as shown in FIG. 3A, the codebooks X, Y and Z may be programmed along the sets of row lines 131.1-3 of the neuromorphic memory device 101 respectively. For example, the code hypervectors $x^1$, $x^2$ and $x^3$ may be programmed along the row lines 131.1, 131.2 and 131.3 respectively. The code hypervectors $y^1$, $y^2$ and $y^3$ may be programmed along the row lines 131.4, 131.5 and 131.6 respectively. The code hypervectors $z^1$, $z^2$ and $z^3$ may be programmed along the row lines 131.7, 131.8 and 131.9 respectively.

In the following state S302 as shown in FIG. 3B, an input hypervector s may be stored in the input buffer 123. The resonator network system 100 may be configured to factorize the input hypervector s into individual hypervectors representing the set of three concepts respectively i.e., that is, the hypervector s may be defined as follows $s=x^\alpha \odot y^\beta \odot z^\gamma$. The iterative process may find $x^\alpha$, $y^\beta$, $z^\gamma$ where $\alpha \in \{1,2,3\}$, $\beta \in \{1,2,3\}$ and $\gamma \in \{1,2,3\}$.

In state S303 as shown in FIG. 3C, equal attentions may be applied to the set of row lines associated with codebook X (e.g., as shown in FIG. 3C the three elements of the attention vector $a_x(t=0)$ are $a_x(0)^1=a^1=0.33$, $a_x(0)^2=a^2=0.33$ and $a_x(0)^3=a^3=0.33$). This may enable computation of an initial estimate hypervector $\hat{x}(0)$ that represents the concept of the codebook X.

In state S304 as shown in FIG. 3D, the estimate hypervector $\hat{x}(0)$ may be received through the column lines of the neuromorphic memory device 101. The estimate hypervector $\hat{x}(0)$ may result from the multiplication of the attention vector $a_x(0)$ with the stored codebook X as follows: $\hat{x}(0)=a_x(0)X^T$. Also, a quantization may further be applied in order to obtain the estimate hypervector $\hat{x}(0)$. For example, if the output from the crossbar comes through an ADC, a quantization may be applied through a digital thresholding circuit. If the output from the crossbar comes through a series of sense amplifiers, then the quantization may be built into the sense amp. The quantization may, for example, be performed as follows: if an element, e.g., $a_x(0)^1X^T$, of the vector $a_x(0)X^T$ is greater than zero a quantize value of 1 may be assigned to the element and if an element of the vector $a_x(0)X^T$ is less than or equal to zero a quantize value of 0 may be assigned to the element. The initial estimate hypervector $\hat{x}(0)$ may be loaded into the respective estimate buffer 128.1.

In state S305 as shown in FIG. 3E, equal attentions may be applied to the set of row lines associated with codebook Y (e.g., as shown in FIG. 3E the three elements of the attention vector $a_y(0)$ are $a_y(0)^1=b^1=0.33$, $a_y(0)^2=b^2=0.33$ and $a_y(0)^3=b^3=0.33$). This may enable computation of an initial estimate hypervector $\hat{y}(0)$ that represents the concept of the codebook Y.

In state S306 as shown in FIG. 3F, the estimate hypervector $\hat{y}(0)$ may be received through the column lines of the neuromorphic memory device 101. The estimate hypervector $\hat{y}(0)$ may result from the multiplication of the attention vector $a_y(0)$ with the stored codebook Y as follows: $\overline{y}(0)=a_y(0)Y^T$. Also, a quantization may further be applied in order to obtain the estimate hypervector $\hat{y}(0)$. For example, if the output from the crossbar comes through an ADC, a quantization may be applied through a digital thresholding circuit. If the output from the crossbar comes through a series of sense amplifiers, then the quantization may be built into the sense amp. The quantization may, for example, be performed as follows: if an element, e.g., $a_y(0)^1Y^T$, of the vector $a_y(0)Y^T$ is greater than zero a quantize value of 1 may be assigned to to the element and if an element of the vector $a_y(0)Y^T$ is less than or equal to zero a quantize value of 0 may be assigned to the element. The initial estimate hypervector $\hat{y}(0)$ may be loaded into the respective estimate buffer 128.2.

In state S307 as shown in FIG. 3G, equal attentions may be applied to the set of row lines associated with codebook Z (e.g., as shown in FIG. 3G the three elements of the attention vector $a_z(0)$ are $a_z(0)^1=c^1=0.33$, $a_z(0)^1=c^2=0.33$ and $a_z(0)^3=c^3=0.33$). This may enable computation of an initial estimate hypervector $\hat{z}(0)$ that represents the concept of the codebook Z.

In state S308 as shown in FIG. 3H, the estimate hypervector $\hat{z}(0)$ may be received through the column lines of the neuromorphic memory device 101. The estimate hypervector $\hat{z}(0)$ may result from the multiplication of the attention vector $a_z(0)$ with the stored codebook Z as follows: $\hat{z}(0)=a_z(0)Z^T$. Also, a quantization may further be applied in order to obtain the estimate hypervector $\hat{z}(0)$. For example, if the output from the crossbar comes through an ADC, a quantization may be applied through a digital thresholding circuit. If the output from the crossbar comes through a series of sense amplifiers, then the quantization may be built into the sense amp. The quantization may, for example, be performed as follows: if an element, e.g., $a_z(0)^1Z^T$, of the vector $a_z(0)Z^T$ is greater than zero a quantize value of 1 may be assigned to to the element and if an element of the vector $a_z(0)Z^T$ is less than or equal to zero a quantize value of 0 may be assigned to the element. The initial estimate hypervector $\hat{z}(0)$ may be loaded into the respective estimate buffer 128.3.

The application of the equal attentions to obtain each initial estimate hypervector is an exemplary method for obtaining that initial estimate hypervector but it is not limited thereto. For example, the initial estimate hypervectors may be stored (directly) e.g., by a user, in respective estimate buffers 128.1-3 without using the computation capability of the neuromorphic memory device 101.

In state S309 as shown in FIG. 3I, the computation logic 121 may compute the unbound hypervector $\tilde{x}(0)$ as follows $\tilde{x}(0)=s \odot \hat{y}(0) \odot \hat{z}(0))$, using the current content of the estimate buffers 128.2 and 128.3 and the content of the input buffer 123. The unbound hypervector $\tilde{x}(0)$ may be loaded into the temporal input buffer 124.

In state S310 as shown in FIG. 3J, the elements of the unbound hypervector $\tilde{x}(0)$ may be input to the column lines 132.1-D respectively by applying voltages to the column lines that represent the values of the respective elements of the unbound hypervector $\tilde{x}(0)$. This may enable to compute an update $a_x(t=1)$ of the attention vector $a_x(0)$ as follows: $a_x(1)=\tilde{x}(0)X$. Indeed, dot product operations between the unbound hypervector and the item vectors of the corresponding codebook are performed in-memory to obtain the attention vector. Elements of the computed attention vector $a_x(1)$ may be received through the row lines 131.1, 131.2 and 131.3 respectively. For example, the row lines 131.4-9 may be deactivated so that the attention vector $a_x(1)$ may be received. As shown in FIG. 3J the three elements of the attention vector $a_x(1)$ are $a_x(1)_1=0.375$, $a_x(1)^2=0.25$ and $a_x(1)^3=0.375$.

In state S311 as shown in FIG. 3K, the current attention vector $a_x(1)$ may be applied to the set of row lines associated with codebook X (the attention vector $a_x(1)$ is feedback to the neuromorphic memory device 101). This may enable computation of an update $\hat{x}(1)$ of the initial estimate hypervector $\hat{x}(0)$ that represents the concept of the codebook X e.g., a weighted sum of item codebook vectors and the corresponding attention elements are calculated in-memory in order to obtain $\hat{x}(1)$. The estimate hypervector $\hat{x}(1)$ may be received through the column lines of the neuromorphic memory device 101. The estimate hypervector $\hat{x}(1)$ may result from the multiplication of the attention vector $a_x(1)$ with the stored codebook X as follows: $i(1)=a_x(1)X^T$. Also, the quantization may further be applied in order to obtain the estimate hypervector $\hat{x}(1)$. The quantization may, for example, be performed as follows: if an element, e.g., $a_x(1)^1 X^T$, of the vector $a_x(1)X^T$ is greater than zero a quantize value of 1 may be assigned to the element and if an element of the vector $a_x(1)X^T$ is less than or equal to zero a quantize value of 0 may be assigned to the element. The estimate hypervector $\hat{x}(1)$ may be loaded into the respective estimate buffer 128.1.

In state S312 as shown in FIG. 3L, the computation logic 121 may compute the unbound hypervector $\tilde{y}(0)$ as follows $\tilde{y}(0)=s \odot \hat{x}(1) \odot \hat{z}(0)$, using the current content of the estimate buffers 128.1 and 128.3 and the content of the input buffer 123. The unbound hypervector $\tilde{y}(0)$ may be loaded into the temporal input buffer 124.

In state S313 as shown in FIG. 3M, the elements of the unbound hypervector $\tilde{y}(0)$ may be input to the column lines 132.1-D respectively by applying voltages to the column lines that represent the values of the respective elements of the unbound hypervector $\tilde{y}(0)$. This may enable to compute an update $a_y(1)$ of the attention vector $a_y(0)$ as follows: $a_y(1)=\tilde{y}(0)Y$. Indeed, dot product operations between the unbound hypervector and the item vectors of the corresponding codebook are performed in-memory to obtain the attention vector. Elements of the computed attention vector $a_y(1)$ may be received through the row lines 131.4, 131.5 and 131.6 respectively. For example, the row lines 131.1-3 and 131.7-9 may be deactivated so that the attention vector $a_y(1)$ may be received. As shown in FIG. 3M the three elements of the attention vector $a_y(1)$ are $a_y(1)^1=0.125$, $a_y(1)^2=0.125$ and $a_y(1)^3=0.125$.

In state S314 as shown in FIG. 3N, the current attention vector $a_y(1)$ may be applied to the set of row lines associated with codebook Y (the attention vector $a_y(1)$ is feedback to the neuromorphic memory device 101). This may enable to compute an update $\hat{y}(1)$ of the initial estimate hypervector $\hat{y}(0)$ that represents the concept of the codebook Y e.g., a weighted sum of item codebook vectors and the corresponding attention elements are calculated in-memory in order to obtain $\hat{y}(1)$. The estimate hypervector $\hat{y}(1)$ may be received through the column lines of the neuromorphic memory device 101. The estimate hypervector $\hat{y}(1)$ may result from the multiplication of the attention vector $a_y(1)$ with the stored codebook Y as follows: $\hat{y}(1)=a_y(1)Y^T$. Also, the quantization may further be applied in order to obtain the estimate hypervector $\hat{y}(1)$. The quantization may, for example, be performed as follows: if an element, e.g., $a_y(1)^1 Y^T$, of the vector $a_y(1)Y^T$ is greater than zero a quantize value of 1 may be assigned to the element and if an element of the vector $a_y(1)Y^T$ is less than or equal to zero a quantize value of 0 may be assigned to the element. The estimate hypervector $\hat{y}(1)$ may be loaded into the respective estimate buffer 128.2.

In state S315 as shown in FIG. 3O, the computation logic 121 may compute the unbound hypervector $\tilde{z}(0)$ as follows $\tilde{z}(0)=s \odot \hat{y}(1) \odot \hat{x}(1)$, using the current content of the estimate buffers 128.1 and 128.2 and the content of the input buffer 123. The unbound hypervector $\tilde{z}(0)$ may be loaded into the temporal input buffer 124.

In state S316 as shown in FIG. 3P, the elements of the unbound hypervector $\tilde{z}(0)$ may be input to the column lines 132.1-D respectively by applying voltages to the column lines that represent the values of the respective elements of the unbound hypervector $\tilde{z}(0)$. This may enable to compute an update $a_z(1)$ of the attention vector $a_z(0)$ as follows: $a_z(1)=\tilde{z}(0)Z$. Indeed, dot product operations between the unbound hypervector and the item vectors of the corresponding codebook are performed in-memory to obtain the attention vector. Elements of the computed attention vector $a_z(1)$ may be received through the row lines 131.7, 131.8 and 131.9 respectively. For example, the row lines 131.1-6 may be deactivated so that the attention vector $a_z(1)$ may be received. As shown in FIG. 3P the three elements of the attention vector $a_z(1)$ are $a_z(1)^1=0.25$, $a_z(1)^2=0.25$ and $a_z(1)^3=0.375$.

In state S317 as shown in FIG. 3Q, the current attention vector $a_z(1)$ may be applied to the set of row lines associated with codebook Z (the attention vector $a_z(1)$ is feedback to the neuromorphic memory device 101). This may enable to compute an update $\hat{z}(1)$ of the initial estimate hypervector $\hat{z}(0)$ that represents the concept of the codebook Z e.g., a weighted sum of item codebook vectors and the corresponding attention elements are calculated in-memory in order to obtain $\hat{z}(1)$. The estimate hypervector $\hat{z}(1)$ may be received through the column lines of the neuromorphic memory device 101. The estimate hypervector $\hat{z}(1)$ may result from the multiplication of the attention vector $a_z(1)$ with the stored codebook Z as follows: $\hat{z}(1)=a_z(1)Z^T$. Also, the quantization may further be applied in order to obtain the estimate hypervector $\hat{z}(1)$. The quantization may, for example, be performed as follows: if an element, e.g., $a_z(1)^1 Z^T$, of the vector $a_z(1)Z^T$ is greater than zero a quantize value of 1 may be assigned to the element and if an element of the vector $a_z(1)Z^T$ is less than or equal to zero a quantize value of 0 may be assigned to the element. The estimate hypervector $\hat{z}(1)$ may be loaded into the respective estimate buffer 128.3.

Steps S309 to S317 may be repeated until a predefined convergence criterion is fulfilled. For example, steps S309 to S317 may be repeated until one of the attention values in each codebook exceeds a threshold near to the value 1. Given the range of attention values (close to equal attentions on all vectors in the codebook) that are applied on the bitlines, the values of the estimate hypervectors $\hat{z}$ and $\hat{x}$ may not change in two iterations as shown in FIGS. 3A-Q.

Figure 4:
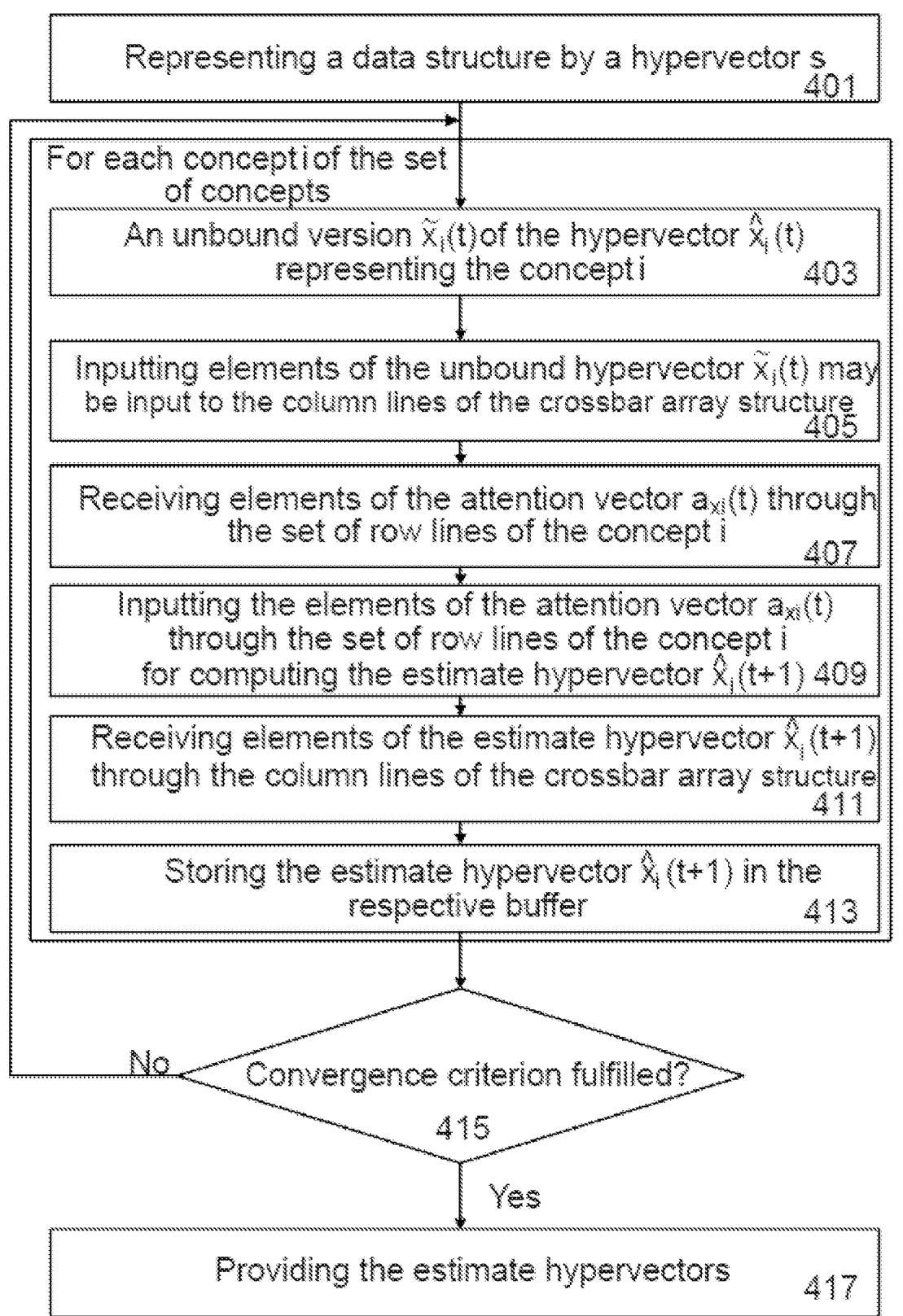
FIG. 4 is a flowchart of a method for factorizing a hypervector in accordance with an example of the present subject matter.

FIG. 4 is a flowchart of a method for factorizing a hypervector in accordance with an example of the present subject matter. For the purpose of explanation, the method described in FIG. 4 may be implemented in the system illustrated in FIG. 1 or 2, but is not limited to this implementation. The method may, for example, be performed by the resonator network system 100.

A data structure may be represented in block 401 by a hypervector s using an encoder such as a VSA based encoder. The data structure may, for example, be a query image representing a visual scene. The encoder may be a feed-forward neural network that is trained to produce the hypervector s as a compound hypervector describing the input visual image. The image may comprise colored MNIST digits. The components of the image may be the color, shape, vertical and horizontal locations of the letters in the image. The encoder may, for example, be configured to compute a hypervector for each letter in the image by multiplying the related quasi-orthogonal hypervectors drawn from four fixed codebooks of four concepts: color codebook (with 7 possible colors), shape codebook (with 26 possible shapes), vertical codebook (with 50 locations), and horizontal codebook (with 50 locations). The product vectors for every letter may be added (component-wise) to produce the hypervector s describing the whole image. The hypervector s may, for example, be stored in the input buffer 123.

The set of concepts comprises F concepts. The codebooks/matrices representing the set of concepts may be referred to as $X_1$, $X_2$ ... $X_F$ respectively. Each codebook $X_i$ may comprise $M_{x_i}$ code hypervectors $$x_i^1 \ldots x_i^{M_{x_i}}.$$

The hypervector s may be estimated to be as follows $s = x_1^{\alpha_1} \odot x_2^{\alpha_2} \ldots \odot x_F^{\alpha_F}$. The present method may enable to find $x_1^{\alpha_1}$, $x_2^{\alpha_2} \ldots x_F^{\alpha_F}$ where $\alpha_i \in \{1, 2, \ldots, M_{x_i}\}$, where i varies between 1 and F.

For each concept i of the set of F concepts, blocks 403 to 413 may be performed.

An unbound version $\tilde{x}_i(t)$ of the hypervector $\hat{x}_i(t)$ representing the concept i may be computed in blocks 403. The index i refers to one concept that is being processed and the index t refers to the current iteration of the method. The unbound version of the hypervector $\hat{x}_i(t)$ may be referred to as the unbound hypervector $\tilde{x}_i(t)$. The unbound hypervector $\tilde{x}_i(t)$ may be computed by using the input hypervector s stored in the input buffer 123 and the first estimates of hypervectors of the concepts j other than the concept i and which are stored in the set of estimate buffers 128.j (i.e., j varies between 1 and F and j is different from i). The computation logic 221 may, for example, compute the unbound hypervector $\tilde{x}_i(t)$ as follows $\tilde{x}_i(t) = s \odot \hat{x}_1(t) \ldots \odot \hat{x}_{i-1}(t) \odot \hat{x}_{i+1}(t) \ldots \odot \hat{x}_F(t)$.

The D elements of the unbound hypervector $\tilde{x}_i(t)$ may be input in block 405 to the column lines 132.1-D respectively. This may trigger the in-memory computation of the product $\tilde{x}_i(t)X_i$ using the memresistive electronic devices 133. This product $\tilde{x}_i(t)X_i$ defines the attention vector $a_{x_i}(t)$, $a_{x_i}(t) = \tilde{x}_i(t)X_i$.

The $M_{x_i}$ elements of the attention vector $a_{x_i}(t)$ may be received in block 407 through the set of row lines 135.i of the concept i.

The attention vector $a_{x_i}(t)$ may be input in block 409 to the set of row lines 135.i of the concept i for in-memory computing a linear combination of the candidate code hypervectors, weighted by elements in the attention vector $a_{x_i}(t)$ as follows: $a_{x_i}(t)X_i^T$. The product $a_{x_i}(t)X_i^T$ may define an estimate hypervector $\hat{x}_i(t+1) = a_{x_i}(t)X_i^T$ which is an update of the estimate hypervector $\hat{x}_i(t)$.

The D elements of the estimate hypervector $\hat{x}_i(t+1)$ may be received in block 411 through the column lines 132.1-D respectively.

The estimate hypervector $\hat{x}_i(t+1)$ may be stored in block 413 in the respective estimate buffer 128.i.

It may be determined (block 415) whether the attention vectors $a_{x_i}(t)$ fulfil a convergence criterion.

In case the attention vectors $a_{x_i}(t)$ fulfil the convergence criterion, the iteration may be stopped in block 417. And the estimate hypervectors $\hat{x}_i(t+1)$ which are obtained by the attention vectors $a_{x_i}(t)$ may be provided in block 417. The estimate hypervectors $\hat{x}_i(t+1)$ may be used to factorize the input hypervector s e.g., as follows $s = \hat{x}_1(t+1) \odot \hat{x}_2(t+1) \ldots \odot \hat{x}_F(t+1)$.

In case the attention vectors $a_{x_i}(t)$ do not fulfil the convergence criterion, blocks 403 to 415 may be repeated as indicated in FIG. 4.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The invention claimed is:

1. A system comprising:
a neuromorphic memory device with a crossbar array structure comprising row lines and column lines; resistive memory elements coupled between the row lines and the column lines at junctions formed by the row and column lines; the resistive memory elements of each set of row lines storing a value of respective code hypervectors of a codebook; each associated codebook comprising candidate code hypervectors;
an input buffer for storing an input hypervector;
a plurality of estimate buffers each associated with a different subset of row lines and a different codebook and for initially storing estimated hypervectors that are derived from respective code hypervectors that are stored in the associated subset of row lines; and
a control circuit connected to the neuromorphic memory device;
the control circuit is configured to iteratively:
compute an unbound hypervector using the input hypervector and all the estimated hypervectors;
compute an attention vector that indicates a similarity of the unbound hypervector with one estimated hypervector;
compute a linear combination of the one estimated hypervector, weighted by the attention vector; and
store the computed linear combination in the estimate buffer that is associated with the one estimated hypervector.

2. The system of claim 1, wherein the attention vector is computed using binary dot product operations between the unbound hypervector and the one estimated hypervector.

3. The system of claim 1, wherein the attention vector is computed using bipolar dot product operations between the unbound hypervector and the one estimated hypervector.

4. The system of claim 1, wherein each value of respective code hypervectors of the codebook stored in the row lines is static.

5. The system of claim 1, wherein the control circuit is further configured to input the attention vector to the set of row lines associated with the one estimated hypervector by applying voltages to the set of row lines associated with the one estimated hypervector respectively, wherein each voltage is representative of a respective element of the attention vector.

6. The system of claim 1, the control circuit being configured to input the unbound hypervector to the column lines of the neuromorphic memory device by applying voltages to the column lines respectively, each voltage representing a respective element of the unbound hypervector.

7. The system of claim 1, wherein the linear combination is a weighted sum.

8. The system of claim 1, wherein the control circuit iteratively operates until a predefined number of iterations is reached.

9. The system of claim 1, wherein the crossbar array structure comprises N of said row lines and W of said column lines, where N>1 and W>1, wherein a memory capacity of the neuromorphic memory device is determined by a memory matrix M of dimension N×W.

10. The system of claim 1, further comprising an encoder being configured for representing data structures in a vector space, the vector space being defined by the codebooks, the codebooks comprising the candidate code hypervectors representing items of a respective concept.

11. The system of claim 10, wherein one of the data structures is representative of an image, wherein the codebooks represent the concept of colors, the concept of shapes, the concept vertical positioning, and the concept of horizontal positioning.

12. The system of claim 1, wherein the control circuit iteratively operates to implement a resonator network.

13. A method for factorizing an input hypervector comprising:

storing respective code hypervectors of an associated codebook within row lines of a neuromorphic memory device with a crossbar array structure comprising the row lines and column lines and resistive memory elements coupled between the row lines and the column lines at junctions formed by the row and column lines; each associated codebook comprising candidate code hypervectors;

storing an input hypervector in an input buffer;

storing estimated hypervectors within a plurality of estimate buffers each associated with a different subset of row lines and a different codebook, wherein the estimated hypervectors are derived from respective code hypervectors that are stored in the associated subset of row lines;

computing an unbound hypervector using the input hypervector and all the estimated hypervectors;

computing an attention vector that indicates a similarity of the unbound hypervector with one estimated hypervector;

computing a linear combination of the one estimated hypervector, weighted by the attention vector; and storing the computed linear combination in the estimate buffer that is associated with the one estimated hypervector.

14. A computer program product comprising a computer-readable storage medium having computer-readable program code embodied therewith, wherein when the computer-readable program code is evoked by a processor causes the processor to:

store respective code hypervectors of an associated codebook within row lines of a neuromorphic memory device with a crossbar array structure comprising the row lines and column lines and resistive memory elements coupled between the row lines and the column lines at junctions formed by the row and column lines; each associated codebook comprising candidate code hypervectors;

store an input hypervector in an input buffer;

store estimated hypervectors within a plurality of estimate buffers each associated with a different subset of row lines and a different codebook, wherein the estimated hypervectors are derived from respective code hypervectors that are stored in the associated subset of row lines;

compute an unbound hypervector using the input hypervector and all the estimated hypervectors;

compute an attention vector that indicates a similarity of the unbound hypervector with one estimated hypervector;

compute a linear combination of the one estimated hypervector, weighted by the attention vector; and store the computed linear combination in the estimate buffer that is associated with the one estimated hypervector.

* * * * *